(12) United States Patent
Kanamori et al.

(10) Patent No.: US 11,769,546 B2
(45) Date of Patent: Sep. 26, 2023

(54) NONVOLATILE MEMORY DEVICE, SYSTEM INCLUDING THE SAME AND METHOD FOR FABRICATING THE SAME

(71) Applicant: SAMSUNG ELECTRONICS CO., LTD., Suwon-si (KR)

(72) Inventors: Kohji Kanamori, Seongnam-si (KR); Sang Youn Jo, Suwon-si (KR); Jee Hoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 71 days.

(21) Appl. No.: 17/465,539

(22) Filed: Sep. 2, 2021

(65) Prior Publication Data

US 2022/0101911 A1 Mar. 31, 2022

(30) Foreign Application Priority Data

Sep. 28, 2020 (KR) .......................... 10-2020-0125996

(51) Int. Cl.
*G11C 7/10* (2006.01)
*G11C 11/4093* (2006.01)
*H10B 12/00* (2023.01)

(52) U.S. Cl.
CPC .......... *G11C 11/4093* (2013.01); *H10B 12/50* (2023.02)

(58) Field of Classification Search
CPC .................. G11C 11/4093; H01L 27/10897
USPC ..................................... 365/189.05
See application file for complete search history.

(56) References Cited

U.S. PATENT DOCUMENTS

| | | | |
|---|---|---|---|
| 4,843,034 A * | 6/1989 | Herndon | H01L 21/76877 257/E21.585 |
| 8,501,537 B2 | 8/2013 | Sadaka et al. | |
| 8,941,230 B2 * | 1/2015 | Kyozuka | H01L 24/24 257/E25.018 |
| 9,558,945 B2 | 1/2017 | Fukuzumi et al. | |
| 9,793,250 B2 * | 10/2017 | Kang | H01L 25/105 |
| 10,354,980 B1 * | 7/2019 | Mushiga | H01L 25/0657 |
| 10,566,314 B2 | 2/2020 | Yang | |
| 11,011,539 B2 * | 5/2021 | Xiao | H01L 21/76877 |
| 11,222,697 B2 * | 1/2022 | Nam | G11C 16/3427 |
| 11,227,660 B2 * | 1/2022 | Yu | G11C 16/30 |
| 11,282,827 B2 * | 3/2022 | Yun | H01L 27/11565 |
| 11,532,581 B2 * | 12/2022 | Jung | H01L 24/05 |

(Continued)

FOREIGN PATENT DOCUMENTS

| | | | | |
|---|---|---|---|---|
| CN | 104952843 | | 9/2015 | |
| CN | 112185984 A * | | 1/2021 | ............ G09F 9/30 |

*Primary Examiner* — Viet Q Nguyen
(74) *Attorney, Agent, or Firm* — F. CHAU & ASSOCIATES, LLC

(57) ABSTRACT

A nonvolatile memory device includes a first lower interlayer insulation layer and a second lower interlayer insulation layer that are sequentially stacked in a first direction; a lower metal layer disposed in the first lower interlayer insulation layer; and a plurality of lower bonding metals disposed in the first lower interlayer insulation layer and the second lower interlayer insulation layer and spaced apart from each other in a second direction that intersects the first direction. An uppermost surface in the first direction of the lower metal layer is lower than an uppermost surface in the first direction of the plurality of lower bonding metals, and the lower metal layer is placed between the plurality of lower bonding metals.

20 Claims, 20 Drawing Sheets

(56) References Cited

U.S. PATENT DOCUMENTS

2004/0040739 A1\* 3/2004 Yoshimura ........... H05K 1/0221
174/255
2019/0385966 A1 12/2019 Gao et al.
2021/0005593 A1\* 1/2021 Lee ......................... H01L 24/08

\* cited by examiner

FIG. 3
A - A'
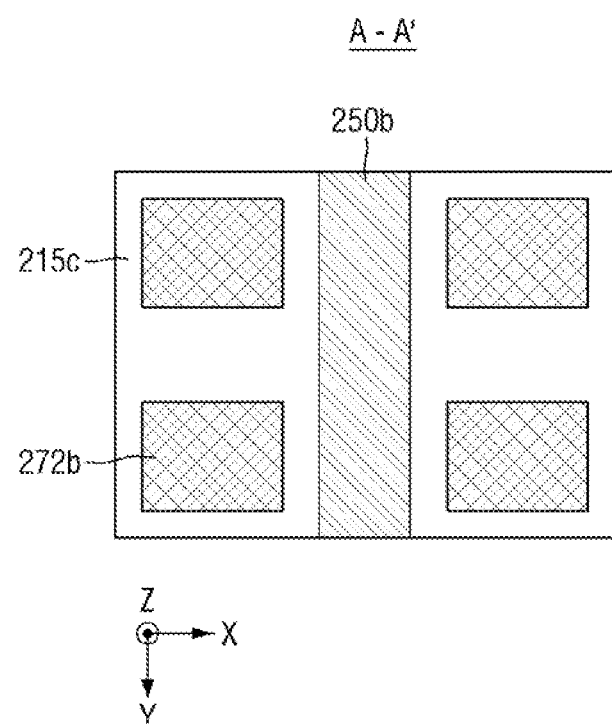
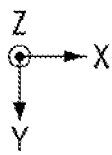

B - B'

NONVOLATILE MEMORY DEVICE, SYSTEM INCLUDING THE SAME AND METHOD FOR FABRICATING THE SAME

CROSS-REFERENCE TO RELATED APPLICATION

This application claims priority under 35 U.S.C. 119 from Korean Patent Application No. 10-2020-0125996, filed on Sep. 28, 2020 in the Korean Intellectual Property Office, the contents of which are herein incorporated by reference in their entirety.

BACKGROUND

1. Technical Field

Embodiments of the present disclosure are directed to a nonvolatile memory device, a system that includes the same, and a method for fabricating the nonvolatile memory device.

2. Discussion of the Related Art

There is a demand for a nonvolatile memory device that can store high capacity data in an electronic system that requires data storage. Accordingly, ways of increasing the data storage capacity of a nonvolatile memory device are being studied. For example, one method for increasing the data storage capacity of a nonvolatile memory device uses memory cells arranged in three-dimensions instead of in two-dimensions.

Another example is a nonvolatile memory device in which an uppermost end of a cell region that includes three-dimensionally arranged memory cells is bonded to an uppermost end of a peripheral circuit region that includes peripheral circuit elements that drive the memory cells.

However, when bonding the uppermost end of the cell region and the uppermost end of the peripheral circuit region, for example, there is an issue with bonding reliability deterioration factors such as a dishing phenomenon.

SUMMARY

Embodiments of the present disclosure provide a nonvolatile memory device that reduces the size of a cell region or a peripheral circuit region and reduces a process unit cost, while maintaining the bonding reliability between the uppermost end of the cell region and the uppermost end of the peripheral circuit region.

Embodiments of the present disclosure also provide a nonvolatile memory system that includes a nonvolatile memory device that reduces the size of the cell region or the peripheral circuit region and reduces the process unit cost, while maintaining the bonding reliability between the uppermost end of the cell region and the uppermost end of the peripheral circuit region.

Embodiments of the present disclosure also provide a method for fabricating a nonvolatile memory device that reduces the size of the cell region and/or the peripheral circuit region and reduces the process unit cost, while maintaining the bonding reliability between the uppermost end of the cell region and the uppermost end of the peripheral circuit region.

According to an embodiment of the present inventive concept, there is provided a nonvolatile memory device that includes: a first lower interlayer insulation layer and a second lower interlayer insulation layer which are sequentially stacked in a first direction, a lower metal layer disposed in the first lower interlayer insulation layer, and a plurality of lower bonding metals disposed in the first lower interlayer insulation layer and the second lower interlayer insulation layer and spaced apart from each other in a second direction that intersects the first direction. An uppermost surface in the first direction of the lower metal layer is lower than an uppermost surface in the first direction of the plurality of lower bonding metals, and the lower metal layer is placed between the plurality of lower bonding metals.

According to another embodiment of the present inventive concept, there is provided a nonvolatile memory device that includes: a first substrate, a plurality of metal lines stacked on the first substrate in a first direction, a channel structure that penetrates the plurality of metal lines, a plurality of upper metal layers electrically connected to the plurality of metal lines and the channel structure, a plurality of upper bonding metals electrically connected to one or more of the plurality of upper metal layers, a first lower interlayer insulation layer and a second lower interlayer insulation layer that are sequentially stacked on the upper bonding metals, a plurality of lower bonding metals electrically connected to the upper bonding metals and disposed in the first lower interlayer insulation layer and the second lower interlayer insulation layer, and a lower metal layer placed between the plurality of lower bonding metals, electrically connected to peripheral circuit elements, and disposed in the second lower interlayer insulation layer. An uppermost surface in the first direction of the lower metal layer is lower than a height at which the plurality of lower bonding metals and the plurality of upper bonding metals meet.

According to another embodiment of the present inventive concept, there is provided a nonvolatile memory system that includes: a main board, a nonvolatile memory device on the main board, and a controller that is electrically connected to the nonvolatile memory devices on the main board. The nonvolatile memory device includes a first substrate, a lower metal layer disposed on the first substrate and spaced apart from the first substrate in a first direction, and a plurality of lower bonding metals that are spaced apart from each other in a second direction that intersects the first direction. An uppermost surface in the first direction of the lower metal layer is lower than an uppermost surface in the first direction of the plurality of lower bonding metals, and the metal layer is placed between the plurality of lower bonding metals.

According to another method of the present inventive concept, there is provided a method for fabricating a nonvolatile memory device, the method comprising: forming a peripheral circuit element on a substrate, forming a first insulation layer on a first direction from the peripheral circuit element, forming first bonding metals and first metal layers inside the first insulation layer; forming a second insulation layer on the first bonding metals and the first metal layers and the first insulation layer, forming a second metal layer inside the second insulation layer that is electrically connected to the first metal layers; stacking a third insulation layer on the second insulation layer and the second metal layer; etching the second insulation layer and the third insulation layer to form a plurality of bonding metals inside the first insulation layer, the second insulation layer and the third insulation layer. The plurality of bonding metals are spaced apart from each other around the second metal layer, and an uppermost surface in the first direction of the second metal layer is lower than an uppermost surface in the first direction of the plurality of bonding metals.

BRIEF DESCRIPTION OF THE DRAWINGS

FIG. 3 is a top view taken along a plane A-A' of FIG. 2.

DETAILED DESCRIPTION

Figure 1:
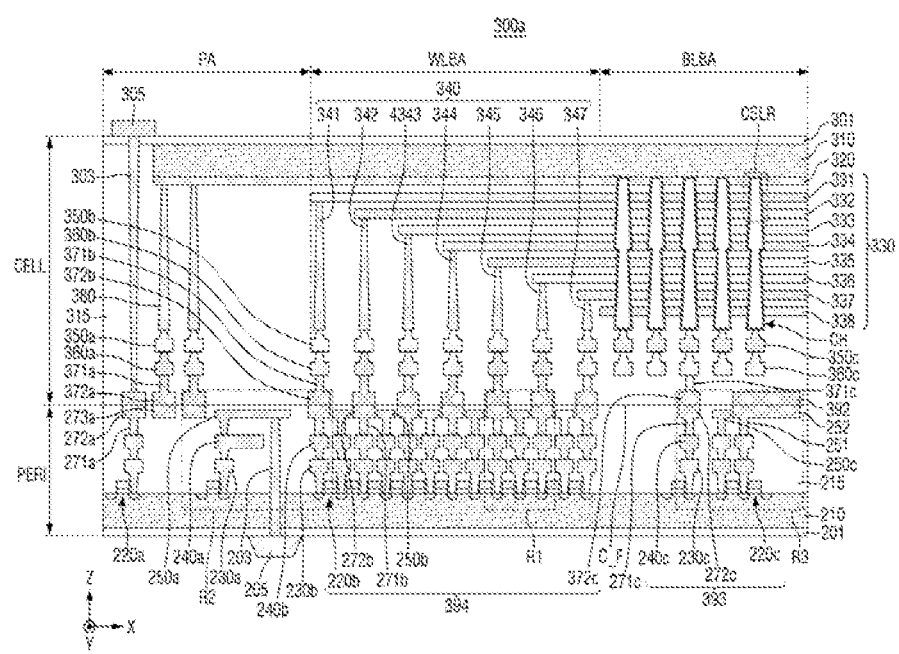
FIG. 1 illustrates explaining a nonvolatile memory device according to some embodiments.

FIG. 1 illustrates a nonvolatile memory device according to some embodiments.

Referring to FIG. 1, a nonvolatile memory device 300a according to some embodiments may has a C2C (chip to chip) structure. The C2C structure refers to a structure in which an upper chip that includes a cell region CELL is manufactured on a first wafer, a lower chip that includes a peripheral circuit region PERI is manufactured on a second wafer different from the first water, after which the upper chip and the lower chip are bonded to each other. For example, the bonding involves electrically connecting an upper bonding metal, such as, 372a, 372b, 372c or 392, formed on an uppermost metal layer of the upper chip and a lower bonding metal, such as 272a, 272b, 272c, 273a or 252, formed on an uppermost metal layer of the lower chip. For example, when the upper bonding metals and the lower bonding metals are formed of copper (Cu), the bonding is a Cu—Cu bonding. In other embodiments, the upper bonding metals and the lower bonding metals may also be formed of aluminum or tungsten.

According to some embodiments, each of the peripheral circuit region PERI and the cell region CELL of the nonvolatile memory device 300a includes an external pad bonding region PA, a word line bonding region WLBA, and a bit line bonding region BLBA.

According to some embodiments, the peripheral circuit region PERI includes a first substrate 210, a lower interlayer insulation layer 215, a plurality of peripheral circuit elements 220a, 220b and 220c formed on the first substrate 210, first metal layers 230a, 230b and 230c connected to each of the plurality of peripheral circuit elements 220a, 220b and 220c, and second metal layers 240a, 240b and 240c formed on the first metal layers 230a, 230b and 230c. The peripheral circuit elements 220b is a region of the substrate 210 between structures that protrude into the substrate 210 below the first metal layers 230b. That is, the peripheral circuit elements 220b refer to a planar transistor with a channel between the structures, such as a source/drain, that protrude into the substrate 210 below the first metal layers 230b. In some embodiments, the first metal layers 230a, 230b and 230c are formed of tungsten which has a relatively high resistance, and the second metal layers 240a, 240b and 240c are formed of copper which has a relatively low resistance.

In the present specification, although only the first metal layers 230a, 230b and 230c and the second metal layers 240a, 240b and 240c are shown and described, embodiments of the present disclosure are not limited thereto, and at least one or more metal layers may be further formed on the second metal layers 240a, 240b and 240c. At least a part of one or more metal layers formed above the second metal layers 240a, 240b and 240c may be formed of aluminum, etc., which has a lower resistance than the copper that forms the second metal layers 240a, 240b and 240c.

According to some embodiments, the lower interlayer insulation layer 215 is placed on the first substrate 210 that covers a plurality of peripheral circuit elements 220a, 220b and 220c, the first metal layers 230a, 230b and 230c, and the second metal layers 240a, 240b and 240c, and includes insulating materials such as silicon oxides and silicon nitrides. The lower interlayer insulation layer 215 may include a plurality of layers.

According to some embodiments, lower bonding metals 271b and 272b are formed on the second metal layer 240b of the word line bonding region WLBA. In the word line bonding region WLBA, the lower bonding metals 271b and 272b of the peripheral circuit region PERI are electrically connected to the upper bonding metals 371b and 372b of the cell region CELL. The lower bonding metals 271b and 272b and the upper bonding metals 371b and 372b are formed of at least one of aluminum, copper, or tungsten, etc. The plurality of lower bonding metals 271b and 272b and the plurality of upper bonding metals 371b and 372b are each spaced apart from each other in a first direction x.

According to some embodiments, the size of the peripheral circuit region PERI can be reduced and the process unit price can be reduced, by merging the metal layers in the peripheral circuit region PERI to form a single wiring. For example, a third metal layer is assumed to be formed above the second metal layers 240a, 240b and 240c of the peripheral circuit region PERI. When the third metal layer is formed above the second metal layers 240a, 240b and 240c, the thickness of the peripheral circuit region PERI in a third direction z is greater than the thickness of the peripheral circuit region PERI shown in this drawing. However, when the third metal layer is merged in the third direction z with the lower metal layers 250a, 250b and 250c, the third metal layer can be removed.

According to some embodiments, each of the lower metal layers 250a, 250b and 250c is placed between the plurality of lower bonding metals 271b and 272b. For example, the lower metal layer 250b is placed between the plurality of lower bonding metals 272b. In still another example, the lower metal layer 250a is placed between the lower metal pattern 273a and the lower bonding metal 272b. In still another example, the lower metal layer 250c is placed between the lower bonding metal 272c and a lower metal pattern 252. That is, the size of the peripheral circuit region PERI can be reduced by using a metal layer, such as the lower metal layer 250b, in which one metal layer is merged in the third direction z, and the process unit price can also be reduced.

However, in some embodiments, when the uppermost surface of the merged metal layer, such as the lower metal layer 250b of the word line bonding region WLBA, the lower metal layer 250a of the external pad bonding region PA, or the lower metal layer 250c of the bit line bonding region BLBA, is located at the same height as the height at which the cell region CELL and the peripheral circuit region PERI meet, a dishing phenomenon occurs, and the bonding reliability of the cell region CELL and the uppermost end of the peripheral circuit region PERI may be degraded.

Therefore, in the nonvolatile memory device 300a according to some embodiments, the uppermost surface of the merged metal layer, such as the lower metal layer 250b of the word line bonding region WLBA, the lower metal layer 250a of the external pad bonding region PA, or the lower metal layer 250c of the bit line bonding region BLBA, is lower than the height at which the cell region CELL and the peripheral circuit region PERI meet. As a result, the dishing phenomenon can be prevented when performing a flattening process on the metals, such as the plurality of lower bonding metals 272b, the lower metal pattern 273a, and the lower metal pattern 252, placed on a plane at which the cell region CELL and the peripheral circuit region PERI meet. Accordingly, the size of the peripheral circuit region. PERI and the process unit price can both be reduced while maintaining the bonding reliability of the cell region CELL and the uppermost surface of the peripheral circuit region PERI.

A structure and a method of fabricating a nonvolatile memory device in the word line bonding region WLBA according to some embodiments will be described in detail below with reference to FIGS. 2 to 9.

Figure 2:
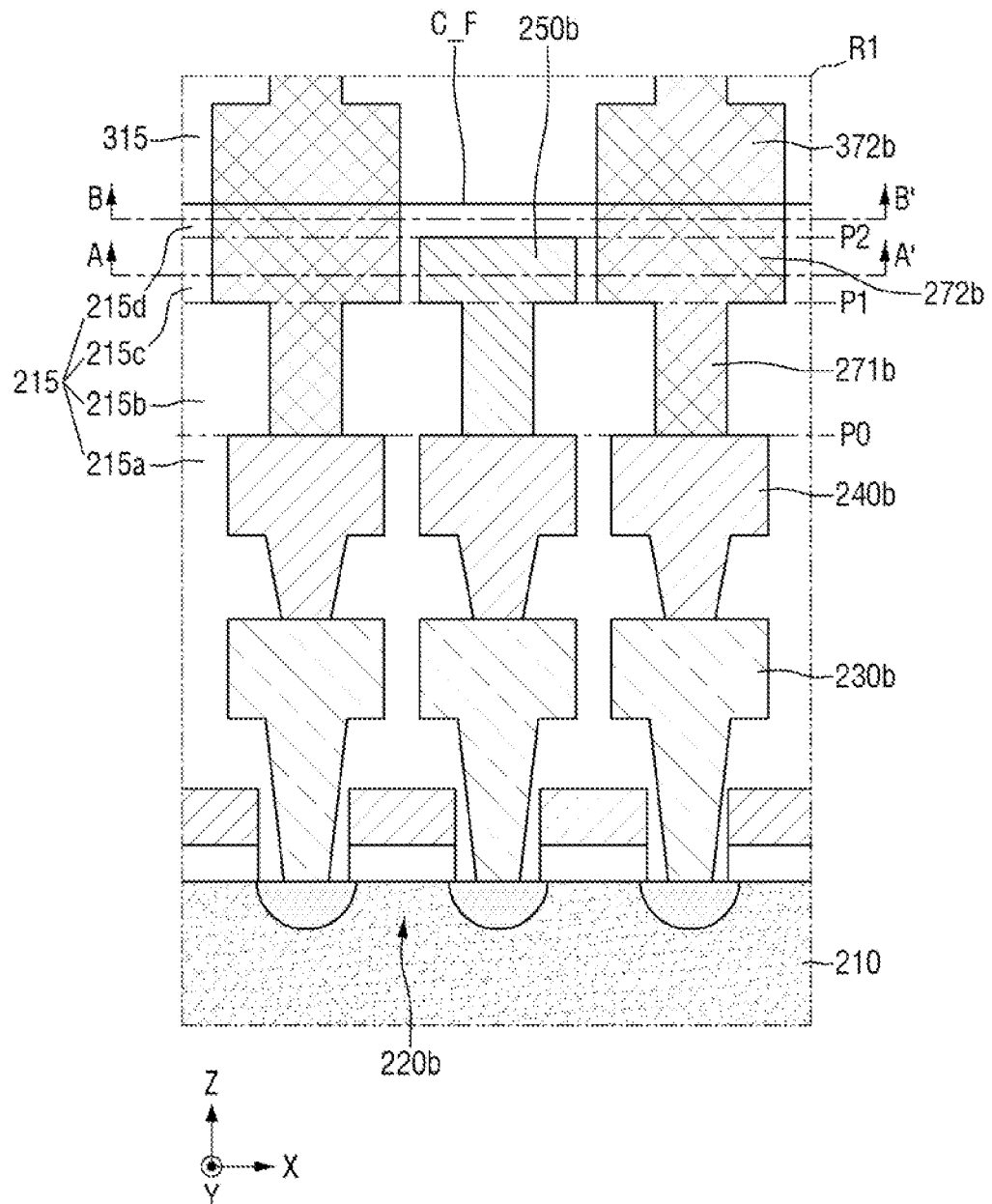
FIG. 2 is an enlarged schematic view of a region R1 of FIG. 1.

FIG. 2 is an enlarged schematic view of a region R1 of FIG. 1. For reference, the description of the region R1 of the word line bonding region WLBA applies to other parts of the word line bonding region WLBA.

Referring to FIG. 2, in some embodiments, the uppermost surface P2 in the third direction z of the lower metal layer 250b is lower than the uppermost surface C_F in the third direction z of the lower bonding metals 271b and 272b. The uppermost surface C_F in the third direction z of the lower bonding metals 271b and 272b is a contact face on which the lower bonding metals 272b and the upper bonding metals 372b meet. That is, the contact face C_F is a bonding face on which the cell region CELL and the peripheral circuit region PERI are bonded.

In some embodiments, the lower interlayer insulation layer 215 includes a plurality of lower interlayer insulation layers. A first lower interlayer insulation layer 215a is formed on the first substrate 210. A first metal layer 230b and a second metal layer 240b are formed in the first lower interlayer insulation layer 215a. The first lower interlayer insulation layer 215a may also include a plurality of first lower interlayer insulation layers.

In some embodiments, a second lower interlayer insulation layer 215b is formed on the first lower interlayer insulation layer 215a. Lower bonding metals 271b are formed in the second lower interlayer insulation layer 215b. Further, a via portion of the lower metal layer 250b is formed in the second lower interlayer insulation layer 215b. More specifically, the lower bonding metals 271b and the via portion of the lower metal layer 250b are formed between the lowermost surface P0 and the uppermost surface P1 of the second lower interlayer insulation layer 215b.

In some embodiments, a third lower interlayer insulation layer 215c is formed on the second lower interlayer insulation layer 215b. A pad region of the lower metal layer 250b is formed in the third lower interlayer insulation layer 215c. Further, at least a part of each of the lower bonding metals 272b is formed in the third lower interlayer insulation layer 215c. More specifically, at least a part of the lower bonding metals 272b and the pad portion of the lower metal layer 250b are formed between the lowermost surface P1 and the uppermost surface P2 of the third lower interlayer insulation layer 215c.

In some embodiments, a fourth lower interlayer insulation layer 215d is formed on the third lower interlayer insulation layer 215c. The remaining portion of each of the lower bonding metals 272b is formed in the fourth lower interlayer insulation layer 215d. More specifically, the remaining portion of the lower bonding metals 272b is formed between the lowermost surface P2 and the uppermost surface C_F of the fourth lower interlayer insulation layer 215d.

That is, in some embodiments, the lower metal layer 250b is formed inside the second lower interlayer insulation layer 215b and the third lower interlayer insulation layer 215c, and the lower bonding metals 271b and 272b are formed inside the second lower interlayer insulation layer 215b, the third lower interlayer insulation layer 215c, and the fourth lower interlayer insulation layer 215d.

Accordingly, the lower metal layer 250b is placed between the plurality of lower bonding metals 271b and 27b and is not exposed to the bonding face C_F. This will be described in detail with reference to the top views of FIGS. 3 and 4.

FIG. 3 is a top view taken along a plane A-A' of FIG. 2, where plane A-A' is parallel to the first direction x and a second direction y that crosses the first direction x.

Referring to FIGS. 2 and 3, in some embodiments, when a lower portion of the bonding face C_F exposed by the plane A-A' is viewed from the third direction z, the plurality of lower bonding metals 272b and the lower metal layer 250b formed in the third lower interlayer insulation layer 215c can be seen.

Figure 4:
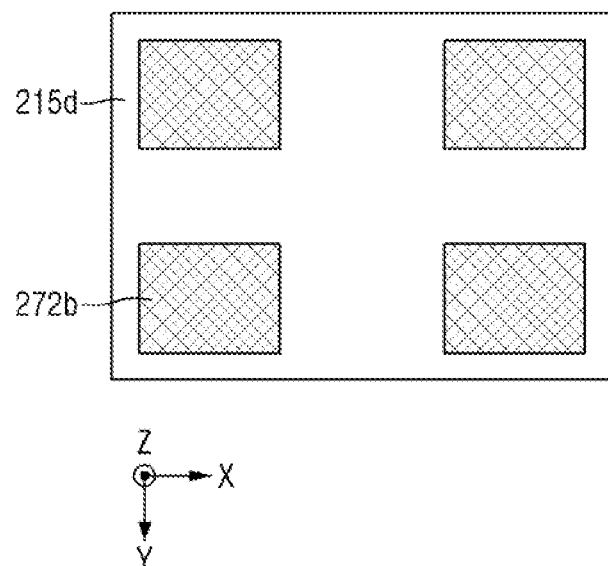
FIG. 4 is a top view taken along a plane B-B' of FIG. 2.

FIG. 4 is a top view taken along a plane B-B' of FIG. 2, where plane B-B' is parallel to the first direction x and the second direction y.

Referring to FIGS. 2 and 4, in some embodiments, when the bonding face C_F exposed by the plane B-B' is viewed from the third direction z, unlike FIG. 3, only a plurality of lower bonding metals 272b formed inside the fourth lower interlayer insulation layer 215d can be seen. That is, it can be verified that the lower metal layer 250b is not exposed to the bonding face C_F.

A method for fabricating a nonvolatile memory device according to some embodiments will be described with reference to FIGS. 5 to 9, below.

FIGS. 5 to 9 illustrate intermediate steps of a method for fabricating a nonvolatile memory device according to some embodiments. For reference, a fabricating method described with reference to FIGS. 5 to 9 is applicable to other regions of a nonvolatile memory device according to some embodiments.

Figure 5:
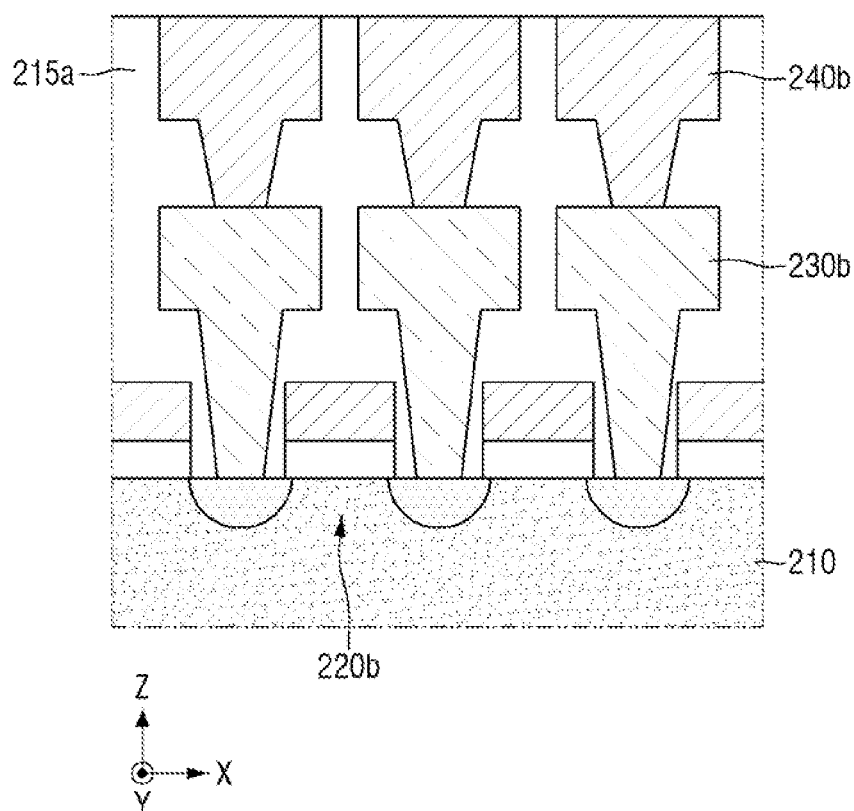
FIGS. 5 to 9 illustrate intermediate steps of a method for fabricating a nonvolatile memory device according to some embodiments.

First, referring to FIG. 5, according to an embodiment, peripheral circuit elements 220b and a first lower interlayer insulation layer 215a are formed an the first substrate 210. The first substrate 210 may include, but is not limited to, a base substrate and an epitaxial layer grown on the base substrate. For example, the first substrate 210 includes only the base substrate without an epitaxial layer. The first substrate 210 is one of a silicon substrate, a gallium arsenic substrate, a silicon germanium substrate, a ceramic substrate, a quartz substrate, or a glass substrate for a display, etc., and may be an SOI (Semiconductor On Insulator) substrate. Hereinafter, the first substrate 210 will be described as a silicon substrate.

After that, according to an embodiment, the first metal layer 230b and the second metal layer 240b that is electrically connected to the peripheral circuit elements 220b are sequentially formed in the third direction z inside the first lower interlayer insulation layer 215a. The first metal layer 230b and the second metal layer 240b each include a via that extends in the third direction z, and a pad that extends in the first direction x and the second direction y. However, the structures of the first metal layer 230b and the second metal layer 240b according to some embodiments are not limited thereto.

Figure 6:
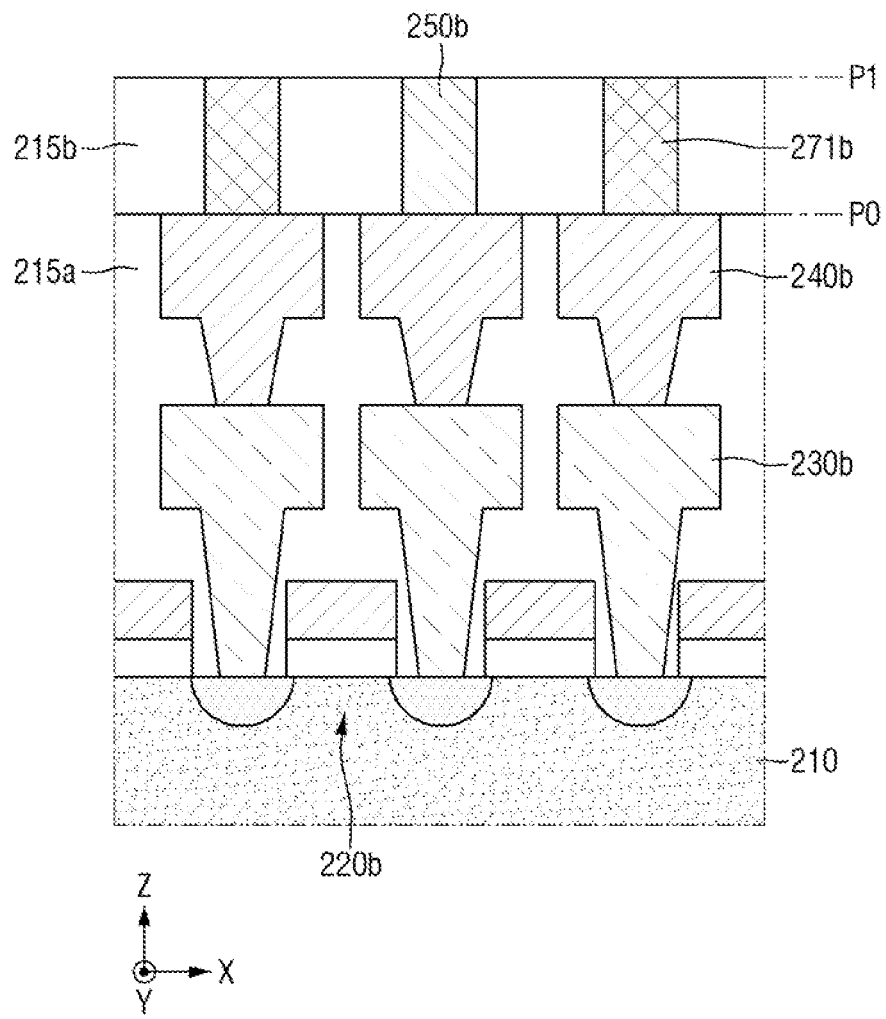

Hereinafter, referring to FIG. 6, according to an embodiment, the second lower interlayer insulation layer 215b is formed on the first lower interlayer insulation layer 215a and the second metal layer 240b.

More specifically, according to an embodiment, the second lower interlayer insulation layer 215b is formed from a first position P0 to a second position P1. The thickness of the second lower interlayer insulation layer 215b is not limited thereto.

In an embodiment, a lower bonding metal 271b is formed inside the second lower interlayer insulation layer 215b. Further, a part of the lower metal layer 250b is formed inside the second lower interlayer insulation layer 215b.

In an embodiment, lower bonding metal 271b is electrically connected to the second metal layer 240b. Further, a part of the lower metal layer 250b is also electrically connected to the second metal layer 240b.

Figure 7:
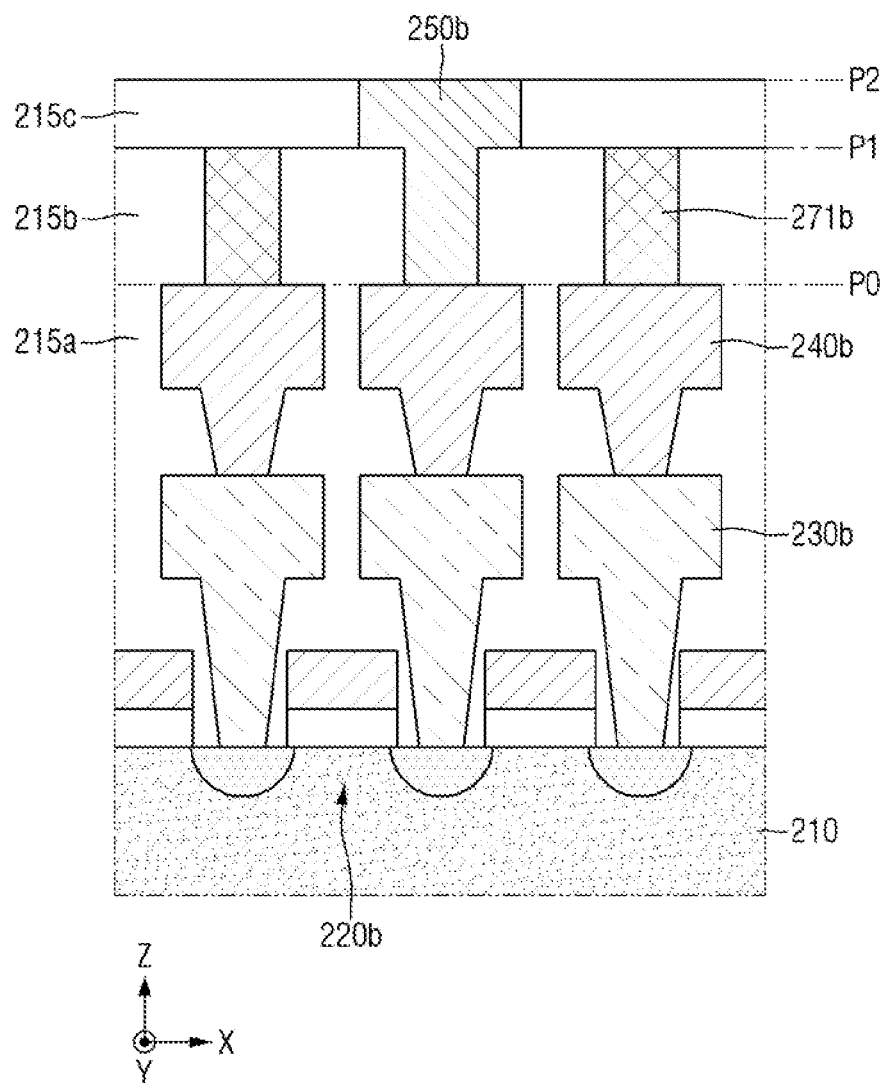

After that, referring to FIG. 7, according to an embodiment, a third lower interlayer insulation layer 215c is formed on a part of the second lower interlayer insulation layer 215b, the lower bonding metal 271b, and the lower metal layer 250b.

In an embodiment, the lower metal layer 250b is formed inside the third lower interlayer insulation layer 215c. The lower metal layer 250b is formed inside the second lower interlayer insulation layer 215b and the third lower interlayer insulation layer 215c. The lower metal layer 250b is electrically connected to the second metal layer 240b.

Figure 8:
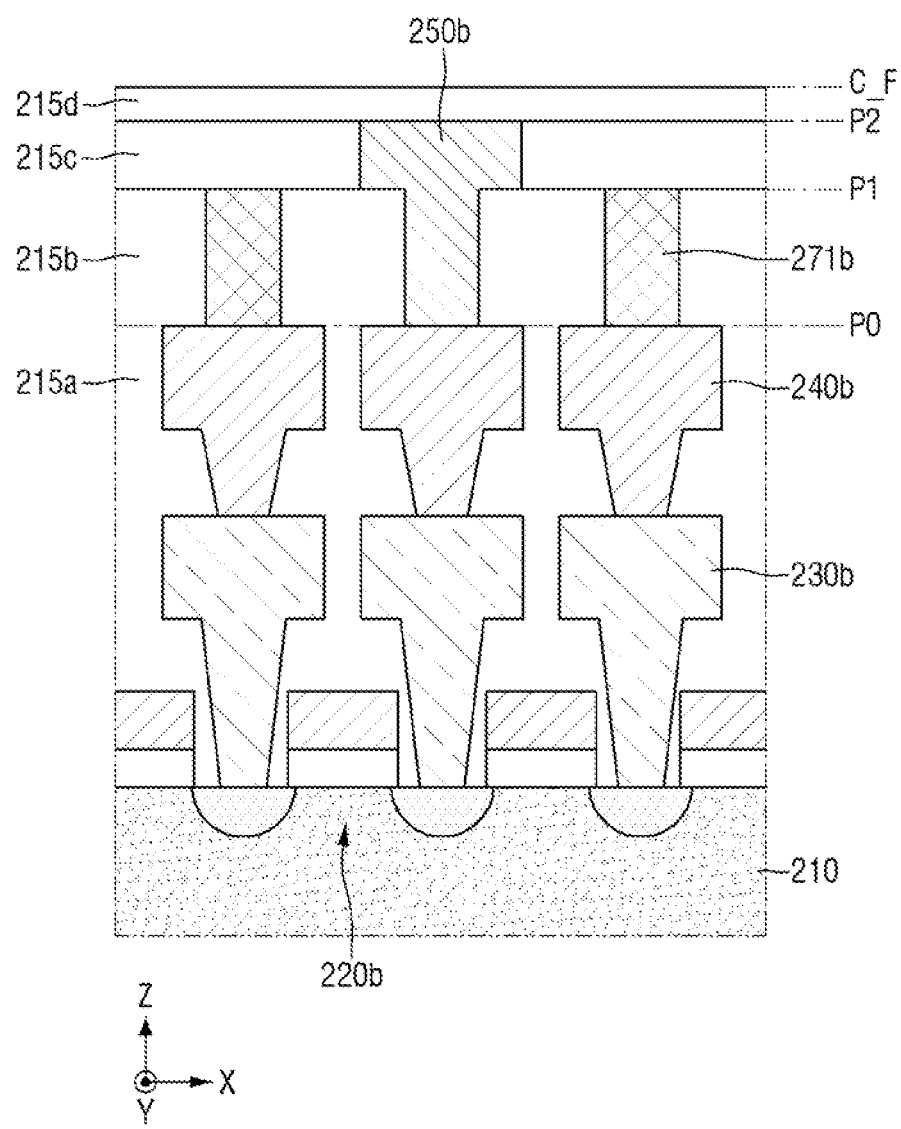

After that, referring to FIG. 8, according to an embodiment, the fourth lower interlayer insulation layer 215d is stacked on the third lower interlayer insulation layer 215c and the lower metal layer 250b.

Figure 9:
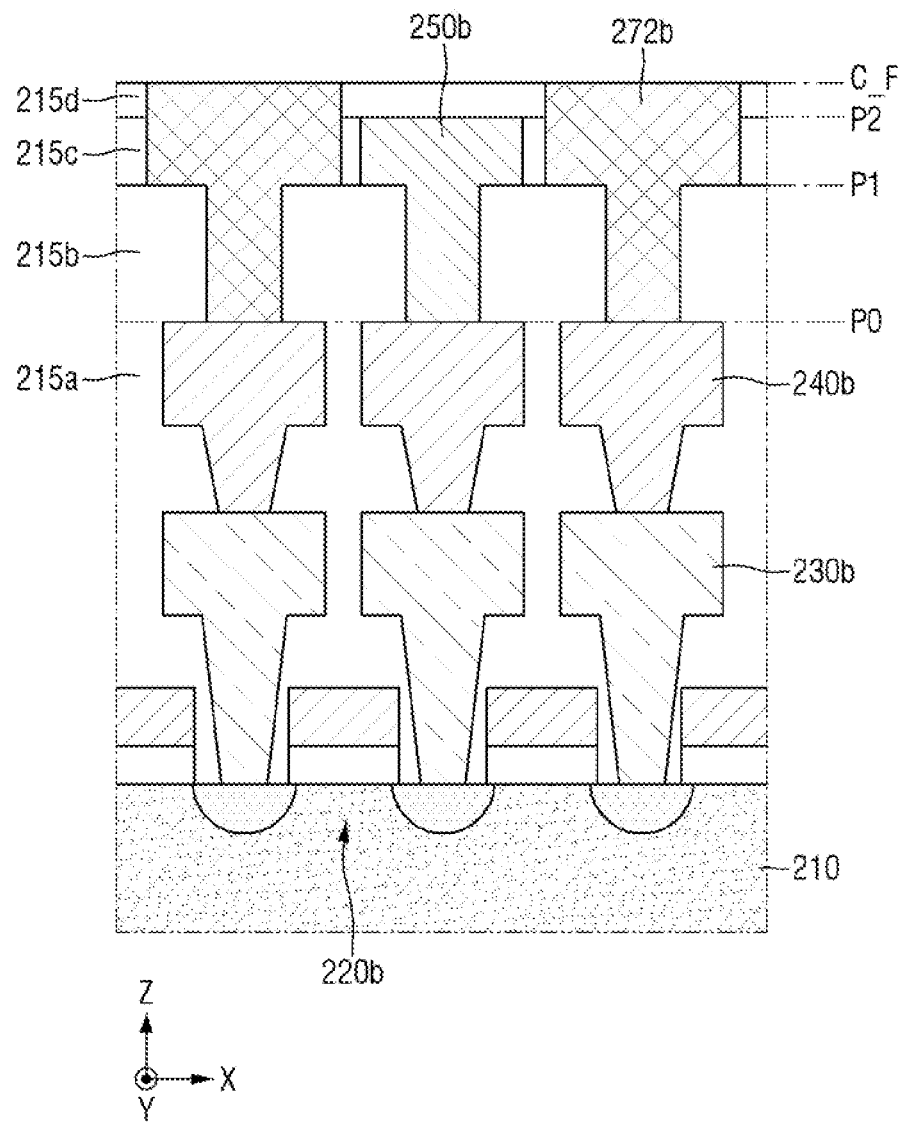

After that, referring to FIG. 9, according to an embodiment, the third lower interlayer insulation layer 215c and the fourth lower interlayer insulation layer 215d are etched to form the lower bonding metal 272b. The lower bonding metal 272b is formed inside in the second lower interlayer insulation layer 215b, the third lower interlayer insulation layer 215c and the fourth lower interlayer insulation layer 215d.

According to an embodiment, the fourth lower interlayer insulation layer 215d is formed from a third position P2 to a fourth position C_F. The thickness of the fourth lower interlayer insulation layer 215d is not limited thereto.

According to an embodiment, each of the first lower interlayer insulation layer 215a to the fourth lower interlayer insulation layer 215d include, for example, at least one of silicon oxide, silicon nitride, silicon oxynitride, or a low dielectric constant (low-k) material that has a lower dielectric constant than silicon oxide. The low dielectric constant material may be, for example, but is not limited to, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, a polyimide, or a porous polymeric material, or combinations thereof.

In addition, according to an embodiment, the material constituting the first metal layer 230b and the material constituting the second metal layer 240b include, for example, but are not limited to, metals such as aluminum (Al), copper (Cu) or tungsten (W).

Referring to FIG. 1 again, according to an embodiment, the cell region CELL includes at least one memory block. The cell region CELL includes a second substrate 310 and a common source line 320. A plurality of metal lines or word lines 330, which include lines 331 to 338, are stacked on the second substrate 310 along a z-axis direction perpendicular to an upper face of the second substrate 310. String selection lines and a ground selection line are placed at each of the top and bottom of the metal lines or word lines 330, and the plurality of word lines 330 are placed between the string selection lines and the ground selection line.

According to an embodiment, in the bit line bonding region BLBA, a channel structure CH extends in a direction perpendicular to the upper face of the second substrate 310, and penetrates the word lines 330, the string selection lines, and the ground selection line.

Figure 10:
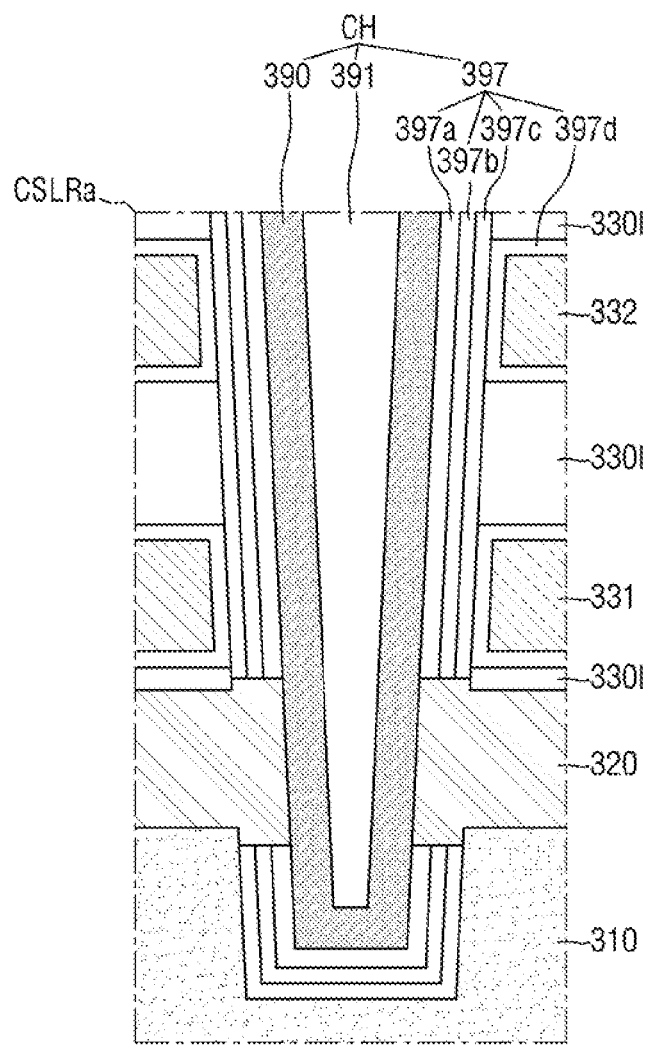
FIGS. 10 and 11 are various enlarged views that illustrate region CSLR of FIG. 1.
Figure 11:
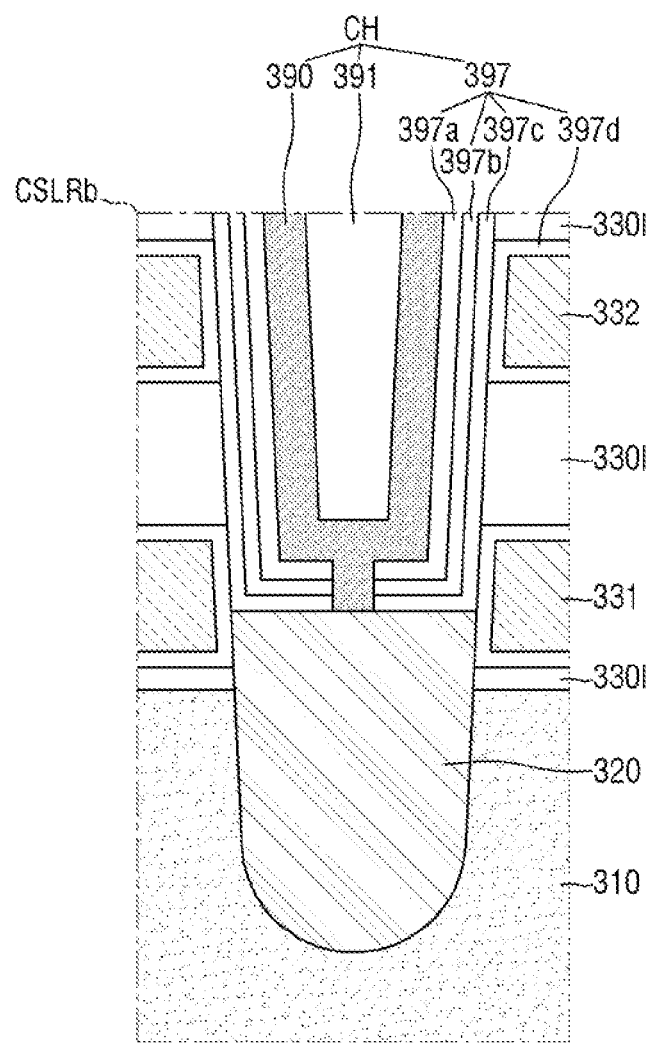

According to an embodiment, the second substrate 310, the common source line 320 and the channel structures CH of the nonvolatile memory device 300a may have various forms. FIGS. 10 and 11 below, illustrate various structures of the second substrate 310, the common source line 320 and the channel structures CH of the nonvolatile memory device 300a according to some embodiments that will be described with reference to an enlarged region CSLR.

FIGS. 10 and 11 are enlarged views that illustrate the region CSLR of FIG. 1. Note that FIGS. 10 and 11 show the region CSLR as being upside-down with respect to the region CSLR shown in FIG. 1.

Referring to FIGS. 1, 10 and 11, according to an embodiment, the channel structure CH includes a data storage layer 397, a channel layer 390, and a buried insulation layer 391. The channel layer 390 is electrically connected to the first metal layer 350c and the second metal layer 360c. For example, the first metal layer 350c is a bit line contact, and the second metal layer 360c is a bit line. In an embodiment, the bit line 360c extends along the second direction y parallel to the upper face of the second substrate 310.

According to an embodiment, the channel structure CH extends in the vertical direction z and penetrates the word lines 330, the string selection lines, and the ground selection line. As shown in FIGS. 10 and 11, the channel structure CH includes a channel layer 390 and a data storage layer 397.

According to an embodiment, the channel layer 390 extends in the third direction Z. Although the channel layer 390 is shown as having a cup shape, this is only an example, and in other embodiments, the channel layer 390 has various other shapes, such as a cylindrical shape, a square tubular shape, a solid filler shape, or a single cup shape. The channel layer 390 includes, but is not limited to, semiconductor materials, such as single crystal silicon, polycrystalline silicon, organic semiconductor matter or carbon nanostructures.

According to an embodiment, the data storage layer 397 is interposed between the channel layer 390 and the word lines 330. For example, the data storage layer 397 extends along the side faces of the channel layer 390.

In some embodiments, the data storage layer 397 is formed of multiple films. For example, the data storage layer 397 includes a tunnel insulation film 397a, a charge storage film 397b and a blocking insulation film 397c that are sequentially stacked on the channel layer 390. The tunnel insulation film 397a includes, for example, a silicon oxide or a high dielectric constant material that has a higher dielectric constant than silicon oxide, such as aluminum oxide ($Al_2O_3$) or hafnium oxide ($HfO_2$). The charge storage film 397b includes, for example, silicon nitride. The blocking insulation film 397c includes, for example, a silicon oxide or a high dielectric constant material that has a higher dielectric constant than silicon oxide. In some embodiments, the data storage layer 397 further includes a gate insulation film 397d that extends along the surface of each word line 330.

In some embodiments, the channel structure CH further includes a buried insulation layer 391. The buried insulation layer 391 fills the inside of the cup-shaped channel layer 390. The buried insulation layer 391 includes, but is not limited to, insulating materials, such as silicon oxides.

According to an embodiment, the common source line 320 is connected to the channel layer 390 of the channel structure CH.

As shown in FIG. 10, in some embodiments, the channel structure CH penetrates the common source line 320 and is buried in the second substrate 310. The common source line 320 penetrates a part of the data storage layer 397 and connects to the side faces of the channel layer 390.

As shown in FIG. 11, in some embodiments, at least a part of the common source line 320 may be buried inside the second substrate 310. The common source line 320 is formed, for example, from the second substrate 310 by a selective epitaxial growth (SEG) process. The channel structure CH penetrates a part of the word line 331 and is connected to the upper face of the common source line 320.

Referring to FIG. 1 again, according to an embodiment, a common source line contact plug 380 is placed in the external pad bonding region PA. The common source line contact plug 380 is formed of a conductive material such as metal, a metal compound, or polysilicon, and is electrically connected to the common source line 320. A first metal layer 350a and a second metal layer 360a are stacked sequentially on the lower part of the common source line contact plug 380. The region in which the common source line contact plug 380, the first metal layer 350a, and the second metal layer 360a are placed is referred to as an external pad bonding region PA.

On the other hand, according to an embodiment, input/output pads 205 and 305 are placed in the external pad bonding region PA. Referring to FIG. 1, a lower insulation film 201 that covers a lower face of the first substrate 210 is formed below the first substrate 210, and a first input/output pad 205 is formed on the lower insulation film 201. The first input/output pad 205 is connected through the first input/output contact plug 203 to at least one of a plurality of circuit elements 220a, 220b and 220c placed in the peripheral circuit region PERI, and is separated from the first substrate 210 by the lower insulation film 201. Further, a side insulation film is placed between the first input/output contact plug 203 and the first substrate 210 that electrically separates the first input/output contact plug 203 and the first substrate 210.

Hereinafter, a structure of a nonvolatile memory device according to some embodiments in the external pad bonding region PA will be described in detail with reference to FIG. 12.

Figure 12:
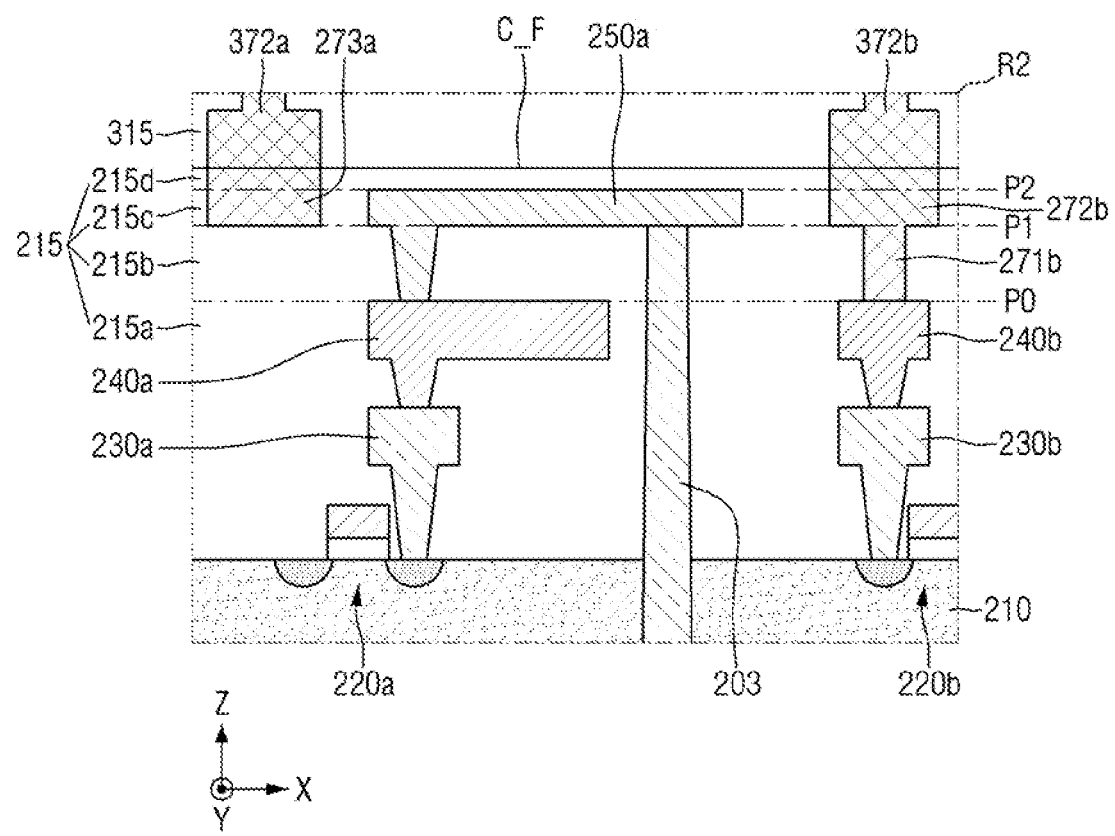
FIG. 12 is an enlarged schematic view of a region R2 of FIG. 1.

FIG. 12 is an enlarged schematic view of a region R2 of FIG. 1. For reference, the description of the region R2 of the external pad bonding region PA is applicable to other parts of the external pad bonding region PA.

Referring to FIG. 12, according to an embodiment, the uppermost surface P2 in the third direction z of the lower metal layer 250a is lower than the uppermost surface C_F in the third direction z of the lower metal pattern 273a and the lower bonding metal 272b. The uppermost surface C_F in the third direction z of the lower metal pattern 273a and the lower bonding metal 272b is a contact face on which the lower metal pattern 273a and the upper metal pattern 372a meet. Further, the uppermost surface C_F is a contact face at which the lower bonding metal 272b and the upper bonding metal 372b meet. That is, the contact face C_F is a bonding face at which the cell region CELL and the peripheral circuit region PERI are bonded.

According to an embodiment, the lower interlayer insulation layer 215 includes a plurality of lower interlayer insulation layers. The first lower interlayer insulation layer 215a is formed on the first substrate 210. First metal layers 230a and 230b and second metal layers 240a and 240b are formed in the first lower interlayer insulation layer 215a. Further, a part of the first input/output contact plug 203 is formed in the first lower interlayer insulation layer 215a. The first lower interlayer insulation layer 215a may also include a plurality of first lower interlayer insulation layers.

According to an embodiment, a second lower interlayer insulation layer 215b is formed on the first lower interlayer insulation layer 215a. A lower bonding metal 271b is formed in the second lower interlayer insulation layer 215b. Further, a via portion of the lower metal layer 250a is formed in the second lower interlayer insulation layer 215b. More specifically, the lower bonding metal 271b and the via portion of the lower metal layer 250a are formed between the lowermost surface P0 and the uppermost surface P1 of the second lower interlayer insulation layer 215b. In addition, the rest of the first input/output contact plug 203 is formed in the second lower interlayer insulation layer 215b.

According to an embodiment, a third lower interlayer insulation layer 215c is formed on the second lower interlayer insulation layer 215b. A pad region of the lower metal layer 250a is formed in the third lower interlayer insulation layer 215c. Further, at least a part of the lower bonding metal 272b is formed in the third lower interlayer insulation layer 215c. Further, a part of the lower metal pattern 273a is formed in the third lower interlayer insulation layer 215c. More specifically, at least a part of the lower bonding metal 272b, the pad portion of the lower metal layer 250a, and a part of the lower metal pattern 273a are formed between the lowermost surface P1 and the uppermost surface P2 of the third lower interlayer insulation layer 215c.

According to an embodiment, a fourth lower interlayer insulation layer 215d is formed on the third lower interlayer insulation layer 215c. The remaining portion of the lower bonding metal 272b is formed in the fourth lower interlayer insulation layer 215*d*. Further, the rest of the lower metal pattern 273*a* is formed in the fourth lower interlayer insulation layer 215*d*. More specifically, the remaining part of the lower bonding metal 272*b* and the remaining part of the lower metal pattern 273*a* are formed between the lowermost surface P2 and the uppermost surface C_F of the fourth lower interlayer insulation layer 215*d*.

That is, according to an embodiment, the lower metal layer 250*a* is formed inside the second lower interlayer insulation layer 215*b* and the third lower interlayer insulation layer 215*c*, and the lower bonding metal 272*b* is formed inside the second lower interlayer insulation layer 215*b*, the third lower interlayer insulation layer 215*c* and the fourth lower interlayer insulation layer 215*d*. Further, the lower metal pattern 273*a* is formed inside the third lower interlayer insulation layer 215*c* and the fourth lower interlayer insulation layer 215*d*.

Since a method for fabricating the region R2 of a nonvolatile memory device according to some embodiments is similar to that described above through FIGS. 5 to 9, a repeated description thereof will be omitted.

Referring to FIG. 1 again, according to an embodiment, an upper insulation film 301 that covers the upper face of the second substrate 310 is formed above the second substrate 310, and the second input/output pad 305 is placed on the upper insulation film 301. The second input/output pad 305 is connected to at least one of a plurality of circuit elements 220*a*, 220*b* and 220*c* placed in the peripheral circuit region PERI through the second input/output contact plug 303.

According to the embodiments, the second substrate 310 and the common source line 320 are not placed in the region in which the second input/output contact plug 303 is placed. In addition, the second input/output pad 305 does not overlap the common source line contact plug 380. Referring to FIG. 1, the second input/output contact plug 303 is separated from the second substrate 310 in the first direction x parallel to the upper face of the second substrate 310, penetrates an upper interlayer insulation layer 315 of the cell region CELL, and is connected to the second input/output pad 305.

According to embodiments, the first input/output pad 205 and the second input/output pad 305 may be selectively formed. For example, the memory device 300*a* includes only the first input/output pad 205 placed above the first substrate 210 or only the second input/output pad 305 placed above the second substrate 310. Or, the memory device 400 includes both the first input/output pad 205 and the second input/output pad 305.

According to embodiments the metal pattern of the uppermost metal layer is present as a dummy pattern in each of the external pad bonding region PA and the bit line bonding region BLBA in each of the cell region CELL and the peripheral circuit region PERI, or the uppermost metal layer may be omitted.

In some embodiments shown in FIG. 1, the region in which the channel structure CH and the bit line 360*c* are placed is referred to as a bit line bonding region BLBA. The bit line 360*c* is electrically connected to the circuit elements 220*c* that form a page buffer 393 in the bit line bonding region BLBA of the peripheral circuit region PERI. For example, the bit line 360*c* is connected to the upper bonding metals 371*c* and 372*c* in the peripheral circuit region PERI, and the upper bonding metals 371*c* and 372*c* are connected to the lower bonding metals 271*c* and 272*c*, which are connected to the circuit elements 220*c* of the page buffer 393.

Hereinafter, a structure of a nonvolatile memory device according to some embodiments in the bit line bonding region BLBA will be described in detail with reference to FIG. 13.

Figure 13:
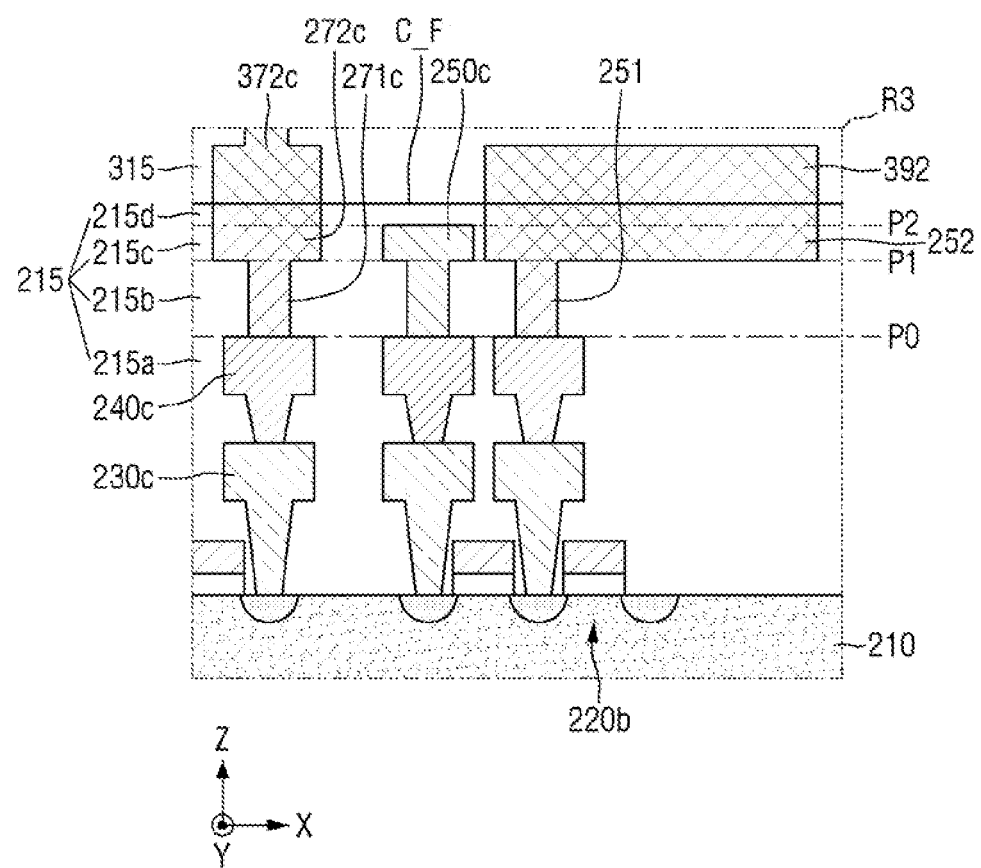
FIG. 13 is an enlarged schematic view of a region R3 of FIG. 1.

FIG. 13 is an enlarged schematic view of the region R3 of FIG. 1. For reference, the description of the region R3 of the bit line bonding region BLBA is applicable to other parts of the bit line bonding region BLBA.

Referring to FIG. 13, according to an embodiment, the uppermost surface P2 in the third direction z of the lower metal layer 250*c* is lower than the uppermost surface C_F in the third direction z of the lower metal pattern 272 and the lower bonding metal 272*c*. The uppermost surface C_F in the third direction z of the lower metal pattern 272 and the lower bonding metal 272*c* is a contact face at which the lower metal pattern 272 and the upper metal pattern 392 meet. Further, the uppermost surface C_F is a contact face at which the lower bonding metal 272*c* and the upper bonding metal 372*c* converge. That is, the contact face C_F is a bonding face at which the cell region CELL and the peripheral circuit region PERI are bonded.

According to an embodiment, the lower interlayer insulation layer 215 includes a plurality of lower interlayer insulation layers. The first lower interlayer insulation layer 215*a* is formed on the first substrate 210. First metal layers 230*c* and second metal layers 240*c* are formed in the first lower interlayer insulation layer 215*a*. The first lower interlayer insulation layer 215*a* may also include a plurality of first lower interlayer insulation layers.

According to an embodiment, the second lower interlayer insulation layer 215*b* is formed on the first lower interlayer insulation layer 215*a*. A lower bonding metal 271*c* and a via portion 251 of the lower metal pattern 252 are formed in the second lower interlayer insulation layer 215*b*. More specifically, the lower bonding metal 271*c*, the via portion 251 of the lower metal pattern 252, and the via portion of the lower metal layer 250*c* are formed between the lowermost surface P0 and the uppermost surface P1 of the second lower interlayer insulation layer 215*b*.

According to an embodiment, a third lower interlayer insulation layer 215*c* is formed on the second lower interlayer insulation layer 215*b*. A pad region of the lower metal layer 250*c* is formed in the third lower interlayer insulation layer 215*c*. Further, at least a part of the lower bonding metal 272*c* is formed in the third lower interlayer insulation layer 215*c*. Further, a part of the lower metal pattern 252 is formed in the third lower interlayer insulation layer 215*c*. More specifically, at least a part of the lower bonding metal 272*c*, the pad portion of the lower metal layer 250*c*, and a part of the lower metal pattern 252 is formed between the lowermost surface P1 and the uppermost surface P2 of the third lower interlayer insulation layer 215*c*.

According to an embodiment, a fourth lower interlayer insulation layer 215*d* is formed on the third lower interlayer insulation layer 215*c*. The remaining portion of the lower bonding metal 272*c* are formed in the fourth lower interlayer insulation layer 215*d*. Further, the rest of the lower metal pattern 252 is formed in the fourth lower interlayer insulation layer 215*d*. More specifically, the remaining portion of the lower bonding metal 272*c* and the remaining portion of the lower metal pattern 252 are formed between the lowermost surface P2 and the uppermost surface C_F of the fourth lower interlayer insulation layer 215*d*.

That is, according to an embodiment, the lower metal layer 250*c* is formed inside the second lower interlayer insulation layer 215*b* and the third lower interlayer insulation layer 215*c*, and the lower bonding metal 272*c* is formed inside the second lower interlayer insulation layer 215b, the third lower interlayer insulation layer 215c and the fourth lower interlayer insulation layer 215d. Further, the lower metal pattern 252 is formed inside the third lower interlayer insulation layer 215c and the fourth lower interlayer insulation layer 215d.

Since a method for fabricating the region R3 of a nonvolatile memory device according to some embodiments is similar to that described above with reference to FIGS. 5 to 9, a repeated description thereof will be omitted.

Referring to FIG. 1 again, according to an embodiment, in the word line bonding region WLBA, the word lines 330 extend along the first direction x parallel to the upper face of the second substrate 310, and are connected to a plurality of cell contact plugs 340, which include cell contact plugs 341 to 347. The word lines 330 and the cell contact plugs 340 are connected at a pad formed by extending at least a part of each word line 330 along the first direction x by a different length. The first metal layer 350b and the second metal layer 360b are sequentially connected to the lower part of the cell contact plugs 340 that are connected to the word lines 330. The cell contact plugs 340 are connected to the peripheral circuit region PERI through the upper bonding metals 371b and 372b of the cell region CELL and the lower bonding metals 271b and 272b of the peripheral circuit region PERI in the word line bonding region WLBA.

According to an embodiment, the cell contact plugs 340 are electrically connected to the circuit elements 220b that form a row decoder 394 in the peripheral circuit region PERI. In an embodiment, the operating voltage of the circuit elements 220b of the row decoder 394 differs from the operating voltage of the circuit elements 220c of the page buffer 393. For example, the operating voltage of the circuit elements 220c of the page buffer 393 is higher than the operating voltage of the circuit elements 220b of the row decoder 394.

In the nonvolatile memory device 300a according to some embodiments, a lower metal pattern 273a has the same shape as the upper metal pattern 372a of the cell region CELL and is formed in the external pad bonding region PA on the uppermost metal layer of the peripheral circuit region PERI to correspond to the upper metal pattern 372a formed in the uppermost metal layer of the cell region CELL. The lower metal pattern 273a is formed on the uppermost metal layer of the peripheral circuit region PERI and is not connected to another contact in the peripheral circuit region PERI. Similarly, in the external pad bonding region PA, an upper metal pattern that has the same shape as the lower metal pattern of the peripheral circuit region PERI is formed on the upper metal layer of the cell region CELL to correspond to the lower metal pattern formed in the uppermost metal layer of the peripheral circuit region PERI.

According to an embodiment, lower bonding metals 271b and 272b are formed on the second metal layer 240b of the word line bonding region WLBA. In the word line bonding region WLBA, the lower bonding metals 271b and 272b of the peripheral circuit region PERI are electrically connected to the upper bonding metals 371b and 372b of the cell region CELL.

Further, according to an embodiment, in the bit line bonding region BLBA, an upper metal pattern 392 that has the same shape as the lower metal pattern 252 of the peripheral circuit region PERI is formed on the uppermost metal layer of the cell region CELL to correspond to the lower metal pattern 252 formed on the uppermost metal layer of the peripheral circuit region PERI. No contact is formed on the upper metal pattern 392 on the uppermost metal layer of the cell region CELL.

Figure 14:
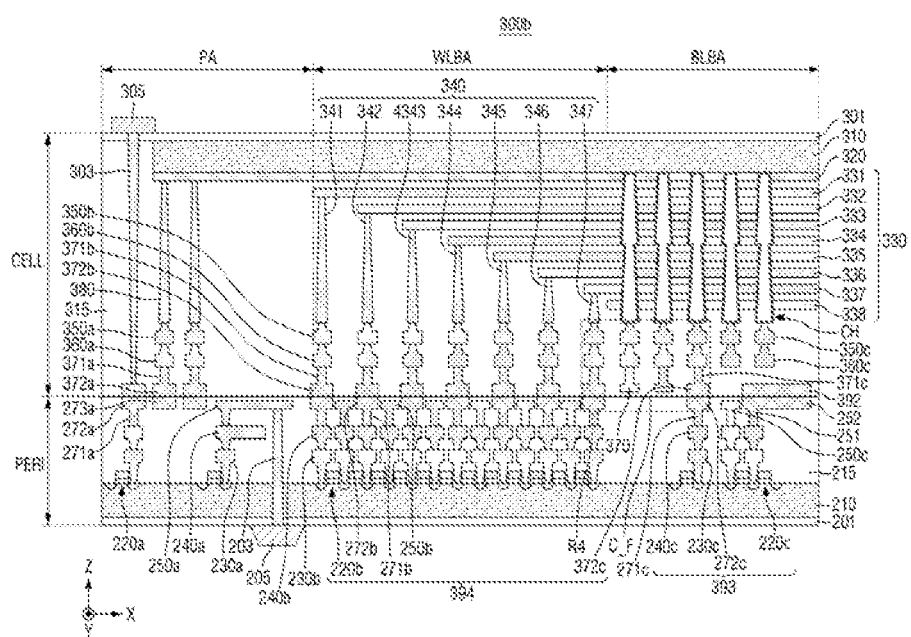
FIG. 14 illustrates another nonvolatile memory device according to some embodiments.

FIG. 14 illustrates another nonvolatile memory device according to some embodiments.

Referring to FIG. 14, another nonvolatile memory device 300b according to some embodiments further includes an upper metal layer 370 in the cell region CELL, unlike the nonvolatile memory device 300a of FIG. 1 according, to some embodiments. The number and shape of the upper metal layer 370 are not limited thereto.

In the cell region CELL according to some embodiments, the size of the cell region CELL is reduced and the process unit price is reduced by merging metal layers to form a single wiring. For example, a third metal layer is assumed to be formed above the second metal layers 360a, 360b and 360c of the cell region CELL. When the third metal layer is formed above the second metal layers 360a, 360b and 360c, the thickness of the cell region CELL in the third direction z is greater than the thickness of the cell region CELL shown in this drawing. However, if the third metal layer is merged with the upper metal layer 370, the third metal layer can be removed.

According to an embodiment, each of the upper metal layers 370 is placed between the plurality of lower bonding metals. For example, the upper metal layer 370 is placed between a plurality of upper bonding metals 372b and 372c. That is, the size of the cell region CELL can be reduced and the process unit price may also be reduced by using a merged metal layer, such as the upper metal layer 370.

However, when the uppermost surface of a merged metal layer, such as the upper metal layer 370, in which one or more metal layers are merged in the third direction z is located at the same height as that at which the cell region CELL and the peripheral circuit region PERI meet, a dishing phenomenon occurs that can degrade the bonding reliability of the cell region CELL and the uppermost end of the peripheral circuit region PERI.

Therefore, in the nonvolatile memory device 300b according to some embodiments, the uppermost surface of the merged metal layer is higher than the height at which the cell region CELL and the peripheral circuit region PERI meet. This makes it possible to prevent a dishing phenomenon from occurring when performing a flattening process on the metals on a surface at which the cell region CELL and the peripheral circuit region PERI meet. Accordingly, both the size of the cell region CELL and the process unit price can be reduced, while maintaining the bonding reliability of the cell region CELL and the uppermost surface of the peripheral circuit region PERI.

A structure of a nonvolatile memory device according to some embodiments in the cell region CELL will be described in detail below with reference to FIG. 15.

Figure 15:
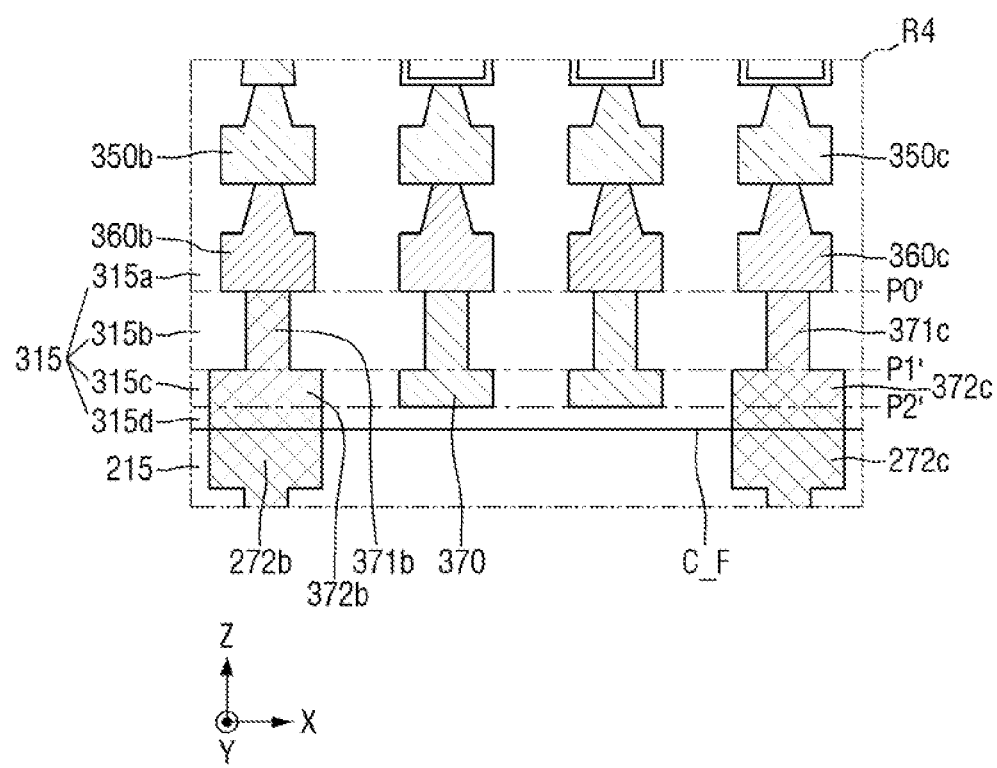
FIG. 15 is a enlarged schematic view of a region R4 of FIG. 14.

FIG. 15 is a schematic enlarged view of a region R4 of FIG. 14. For reference, the description of the region R4 of the cell region CELL is applicable to other parts of the cell region CELL.

Referring to FIG. 15, according to an embodiment, a lowermost surface P2' in the third direction z of the upper metal layer 370 is higher than the lowermost surface C_F in the third direction z of the upper bonding metals 372b and 372c. For reference, the height reference will be described assuming that the contact face C_F between the cell region and the peripheral circuit region is in the lowest position in the third direction z. The lowermost surface C_F in the third direction z of the upper bonding metals 372b and 372c is the contact face at which the upper bonding metals 372b and 372c and the lower bonding metals 272b and 272c meet.

That is, the contact face C_F is a bonding face on which the cell region CELL and the peripheral circuit region PERI are bonded.

According to an embodiment, the upper interlayer insulation layer 315 includes a plurality of upper interlayer insulation layers. The first upper interlayer insulation layer 315a is formed on the second substrate 310 of FIG. 14. First metal layers 350b and 350c and second metal layers 360b and 360c are formed in the first upper interlayer insulation layer 315a. The first upper interlayer insulation layer 315a may also include a plurality of first upper interlayer insulation layers.

According to an embodiment, a second upper interlayer insulation layer 315b is formed on the first upper interlayer insulation layer 315a. Upper bonding metals 371b and 371c are formed in the second upper interlayer insulation layer 315b. Further, a via portion of the upper metal layer 370 is formed in the second upper interlayer insulation layer 315b. More specifically, the upper bonding metals 371b and 371c and the via portion of the upper metal layer 370 are formed between the uppermost surface P0' and the lowermost surface P1' of the second upper interlayer insulation layer 315b.

According to an embodiment, a third upper interlayer insulation layer 315c is formed on the second upper interlayer insulation layer 315b. A pad region of the upper metal layer 370 is formed inside the third upper interlayer insulation layer 315c. Further, at least a part of each of the upper bonding metal 372b and 372c are formed inside the third upper interlayer insulation layer 315c. More specifically, at least a part of the upper bonding metals 372b and 372c and a pad portion of the upper metal layer 370 are formed between the uppermost surface P1' and the lowermost surface P2' of the third upper interlayer insulation layer 315c.

According to an embodiment, a fourth upper interlayer insulation layer 315d is formed on the third upper interlayer insulation layer 315c. Remaining portions of each of the upper bonding metals 372b and 372c are formed inside the fourth upper interlayer insulation layer 315d. More specifically, the remaining portions of the upper bonding metals 372b and 372c are formed between the uppermost surface P2' and the lowermost surface C_F of the fourth upper interlayer insulation layers 315d.

That is, according to an embodiment, the upper metal layer 370 is formed inside the second upper interlayer insulation layer 315b and the third upper interlayer insulation layer 315c, and the upper bonding metals 372b and 372c are formed inside the third upper interlayer insulation layer 315c and the fourth upper interlayer insulation layer 315d.

Accordingly, according to an embodiment, the upper metal layer 370 is placed between a plurality of upper bonding metals 372b and 372c, and is not exposed to the bonding face C_F. Since a method of fabricating the cell region CELL of the nonvolatile memory device 300b according to some embodiments is similar to described above with reference to FIGS. 5 to 9, a repeated description thereof will be omitted.

Figure 16:
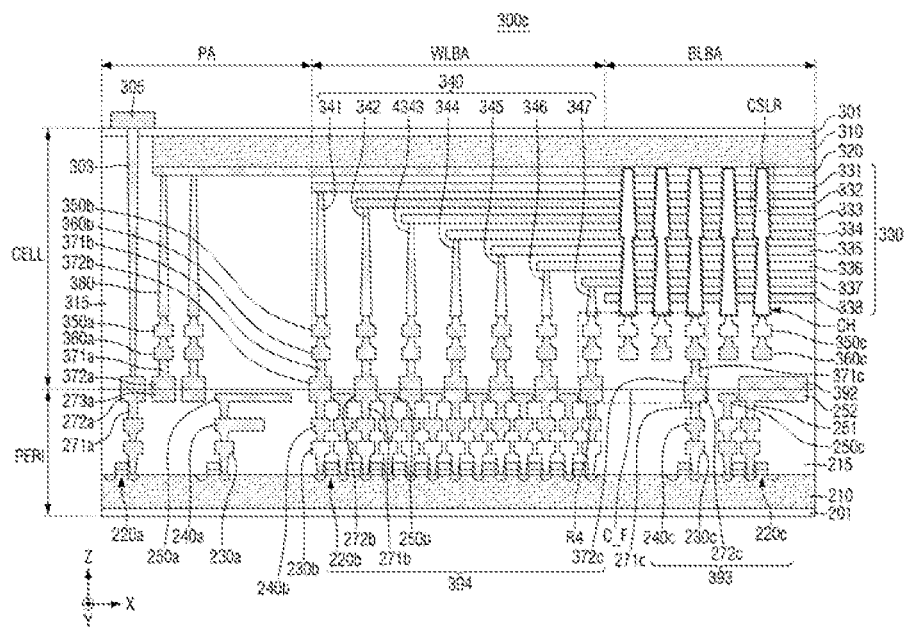
FIG. 16 illustrates another nonvolatile memory device according to some embodiments.

FIG. 16 illustrates another nonvolatile memory device according to some embodiments.

Referring to FIG. 16, unlike the nonvolatile memory device 300a of FIG. 1 according to some embodiments, the first input/output contact plug 203 and the first input/output pad 205 are omitted in another nonvolatile memory device 300c of FIG. 16 according to some embodiments. Since a description of the rest is similar to that of FIG. 1, a repeated description thereof will be omitted.

Figure 17:
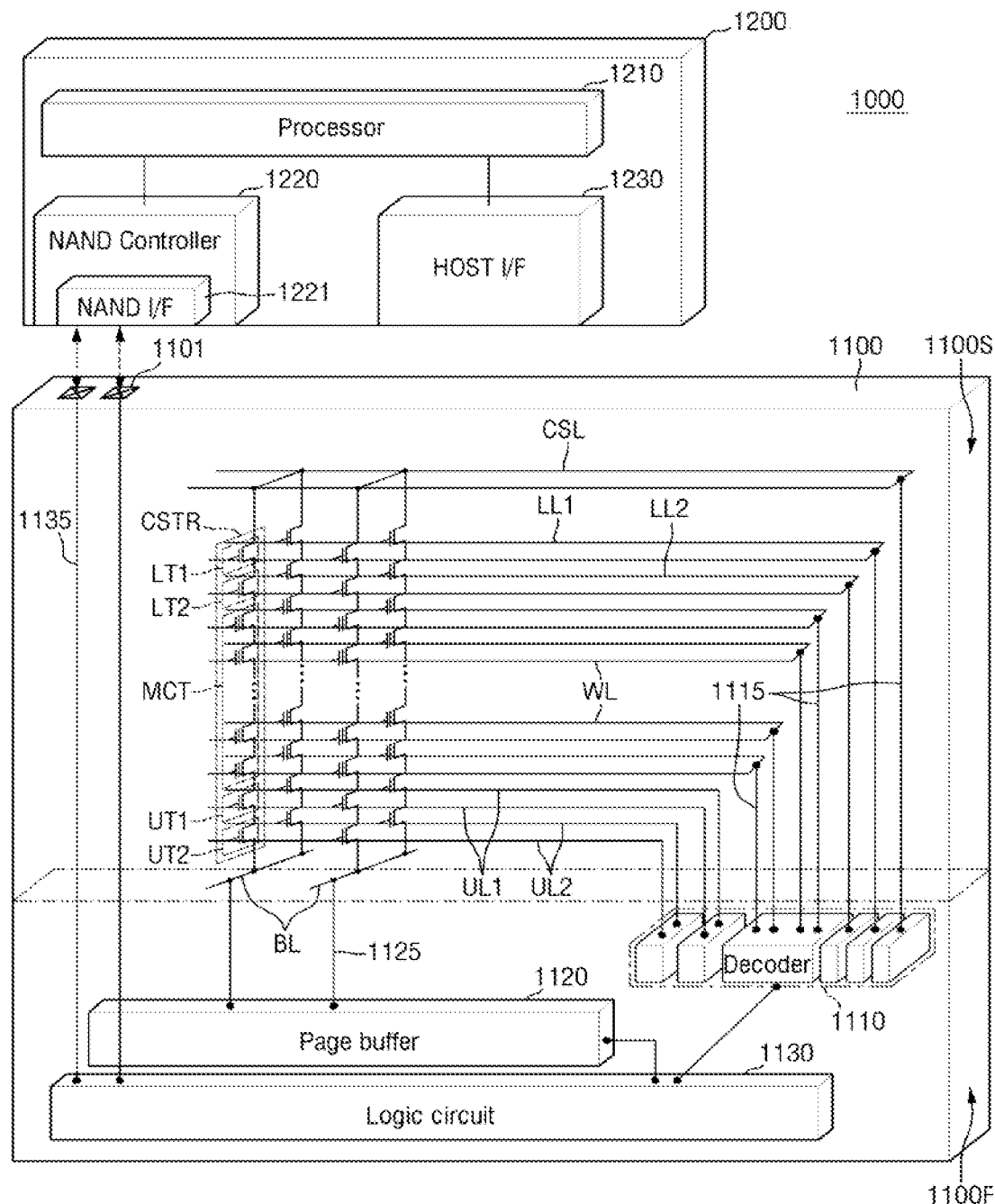
FIG. 17 is a block diagram of a nonvolatile memory system that includes a nonvolatile memory device according to some embodiments.

FIG. 17 is a block diagram of a nonvolatile memory system that includes a nonvolatile memory device according to some embodiments.

Referring to FIG. 17, a nonvolatile memory system 1000 according to some embodiments includes a semiconductor device 1100, and a controller 1200 electrically connected to the semiconductor device 1100. The nonvolatile memory system 1000 may be a storage device that includes one or multiple semiconductor devices 1100, or an electronic device that includes the storage device. For example, the nonvolatile memory system 1000 may be a solid state drive (SSD) device that includes one or multiple nonvolatile memory devices 1100, a Universal Serial Bus (USB), a computing system, a medical device or a communication device.

According to some embodiments, the semiconductor device 1100 is a nonvolatile memory device, and may be, for example, a nonvolatile memory device according to some embodiments described above with reference to FIGS. 1 to 16. The semiconductor device 1100 includes a first structure 1100F, and a second structure 1100S on the first structure 1100F. In some embodiments, the first structure 1100F is placed next to the second structure 1100S. The first structure 1100F is a peripheral circuit structure that includes a decoder circuit 1110, a page buffer 1120, and a logic circuit 1130. The second structure 1100S is a memory cell structure that includes a bit line BL, a common source line CSL, word lines WL, first and second upper gate lines UL1 and UL2, first and second lower gate lines LL1 and LL2, and a memory cell string CSTR between the bit line BL and the common source line CSL.

In the second structure 1100S, according to an embodiment, each memory cell string CSTR includes lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may vary according to the embodiments.

In some embodiments, the upper transistors UT1 and UT2 include a string selection transistor, and the lower transistors LT1 and LT2 include a ground selection transistor. The lower gate lines LL1 and LL2 are gate electrodes of the lower transistors LT1 and LT2, respectively. The word lines WL are gate electrodes of the memory cell transistor MCT, and the upper gate lines UL1 and UL2 are gate electrodes of the upper transistors UT1 and UT2, respectively.

In some embodiments, the lower transistors LT1 and LT2 include a lower erasure control transistor LT1 and a ground selection transistor LT2 that are serially connected to each other. The upper transistors UT1 and UT2 include a string selection transistor UT1 and an upper erasure control transistor UT2 that are serially connected to each other. At least one of the lower erasure control transistor LT1 and the upper erasure control transistor UT1 can be used in an erasure operation that deletes data stored in the memory cell transistor MCT using a gate induced drain leakage (GIDL) phenomenon.

In some embodiments, the common source line CSL, the first and second lower gate lines LL1 and LL2, the word lines WL, and the first and second upper gate lines UL1 and UL2 are electrically connected to the decoder circuit 1110 through first connection wirings 1115 that extend from the first structure 1100F to the second structure 1100S. The bit lines BL are electrically connected to the page buffer 1120 through second connection wirings 1125 that extend from the first structure to the second structure 1100S.

In some embodiments, the first structure 1100F and the second structure 1100S of the semiconductor device 1100 each include a layer that includes bonding metals that connect them to each other. By merging other wirings in the layer that including the bonding metal, the sizes of the first structure 1100F and the second structure 1100S can be reduced, and the process unit price can also be reduced accordingly. In some embodiments, as in nonvolatile memory devices according to some embodiments described above with reference to FIGS. 1 to 16, since the merged wirings are not exposed on the surface on which the first structure 1100F and the second structure 1100S are connected, degradation of the bonding reliability of the first structure 1100F and the second structure 1100S can be prevented.

In some embodiments, in the first structure 1100F, the decoder circuit 1110 and the page buffer 1120 perform control operations on at least one selected memory cell transistor of a plurality of memory cell transistors MCT. The decoder circuit 1110 and the page buffer 1120 are controlled by the logic circuit 1130. The semiconductor device 1100 communicates with the controller 1200 through an input/output pad 1101 that is electrically connected to the logic circuit 1130. The input/output pad 1101 is electrically connected to the logic circuit 1130 through the input/output connection wiring 1135 that extends from the first structure 1100F to the second structure 1100S.

In some embodiments, the controller 1200 includes a processor 1210, a NAND controller 1220, and a host interface 1230. According to some embodiments, the nonvolatile memory system 1000 includes a plurality of semiconductor devices 1100, and in this case, the controller 1200 controls the plurality of semiconductor devices 1100.

In some embodiments, the processor 1210 controls the operation of the entire electronic system 1000 that includes the controller 1200. The processor 1210 operates according to a predetermined firmware, and controls the NAND controller 1220 to access the semiconductor device 1100. The NAND controller 1220 includes a NAND interface 1221 that processes the communication with the semiconductor device 1100. Control commands that control the semiconductor device 1100, data to be recorded in the memory cell transistors MCT of the semiconductor device 1100, data to be read from the memory cell transistors MCT of the semiconductor device 1100, etc., are transmitted through the NAND interface 1221. The host interface 1230 provides a communication function between the electronic system 1000 and an external host. When receiving control commands from an external host through the host interface 1230, the processor 1210 controls the semiconductor device 1100 in response to the control command.

Figure 18:
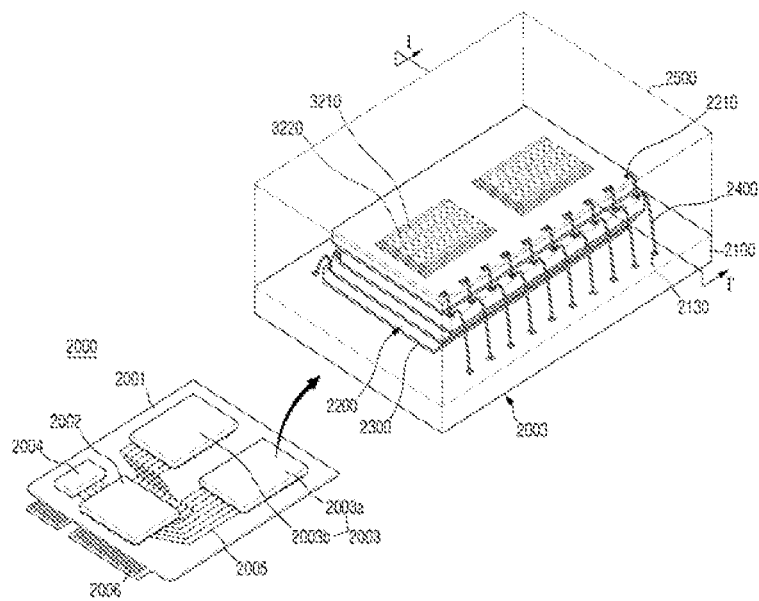
FIG. 18 is a perspective view of a nonvolatile memory system that includes a nonvolatile memory device according to some embodiments.

FIG. 18 is a perspective view of a nonvolatile memory system that includes a nonvolatile memory device according to some embodiments.

Referring to FIG. 18, in some embodiments, a nonvolatile memory system 2000 includes a main board 2001, a controller 2002 mounted on the main board 2001, one or more semiconductor packages 2003, and a DRAM 2004. The semiconductor package 2003 and the DRAM 2004 are connected to the controller 2002 by a wiring pattern 2005 formed on the main board 2001.

In some embodiments, the main board 2001 includes a connector 2006 that includes a plurality of pins that couple to an external host. In the connector 2006, the number and arrangement of the plurality of pins may vary depending on the communication interface between the nonvolatile memory system 2000 and the external host. In exemplary embodiments, the nonvolatile memory system 2000 can communicate with the external host according to any one of a plurality of interfaces, such as M-Phy for a Universal Serial Bus (USB) a Peripheral Component Interconnect Express (PCI-Express), a Serial Advanced Technology Attachment (SATA), or a UFS (Universal Flash Storage). In some embodiments, the nonvolatile memory system 2000 is operated by power received from an external host through the connector 2006. The nonvolatile memory system 2000 further includes a Power Management Integrated Circuit (PMIC) that distributes the power received from the external host to the controller 2002 and the semiconductor package 2003.

In some embodiments, the controller 2002 records data in the semiconductor package 2003 or reads the data from the semiconductor package 2003, and increases the operating speed of the nonvolatile memory system 2000.

In some embodiments, the DRAM 2004 is a buffer memory that reduces a speed difference between the semiconductor package 2003 and the external host. The DRAM 2004 in the nonvolatile memory system 2000 may also operate as a cache memory, and may temporarily store data during control operations of the semiconductor package 2003. When the DRAM 2004 is included in the nonvolatile memory system 2000, the controller 2002 further includes a DRAM controller that controls the DRAM 2004, in addition to the NAND controller that controls the semiconductor package 2003.

In some embodiments, the semiconductor package 2003 includes first and second semiconductor packages 2003a and 2003b that are spaced apart from each other. The first and second semiconductor packages 2003a and 2003b are semiconductor packages that each include a plurality of semiconductor chips 2200. Each of the first and second semiconductor packages 2003a and 2003b includes a package substrate 2100, semiconductor chips 2200 on the package substrate 2100, adhesive layers 2300 placed on a lower face of each semiconductor chip 2200, a connection structure 2400 that electrically connects the semiconductor chips 2200 and the package substrate 2100, and a molding layer 2500 that covers the semiconductor chips 2200 and the connection structure 2400 on the package substrate 2100.

In some embodiments, the package substrate 2100 is a printed circuit substrate that includes package upper pads 2130. Each semiconductor chip 2200 includes an input/output pad 2210. The input/output pad 2210 corresponds to the input/output pad 1101 of FIG. 17. Each of the semiconductor chips 2200 includes a plurality of metal lines 3210 and channel structures 3220. Each of the semiconductor chips 2200 includes a nonvolatile memory device described above with reference to FIGS. 1 to 16.

In some embodiments, the connection structure 2400 is a bonding wire that electrically connects the input/output pad 2210 to the package upper pads 2130. Therefore, in each of the first and second semiconductor packages 2003a and 2003b, the semiconductor chips 2200 are electrically connected to each other by the bonding wire, and are electrically connected to the package upper pads 2130 of the package substrate 2100. According to embodiments, in each of the first and second semiconductor packages 2003a and 2003b, the semiconductor chips 2200 are also electrically connected to each other by a connection structure that includes a through silicon via (TSV), in place of the bonding wire type connection structure 2400.

In some embodiments, the controller 2002 and the semiconductor chips 2200 is also included in one package. In an embodiment, the controller 2002 and the semiconductor chips 2200 are mounted on an interposer substrate that differs from the main board 2001, and the controller 2002 and the semiconductor chips 2200 are also connected to each other by wiring formed on the interposer substrate.

Figure 19:
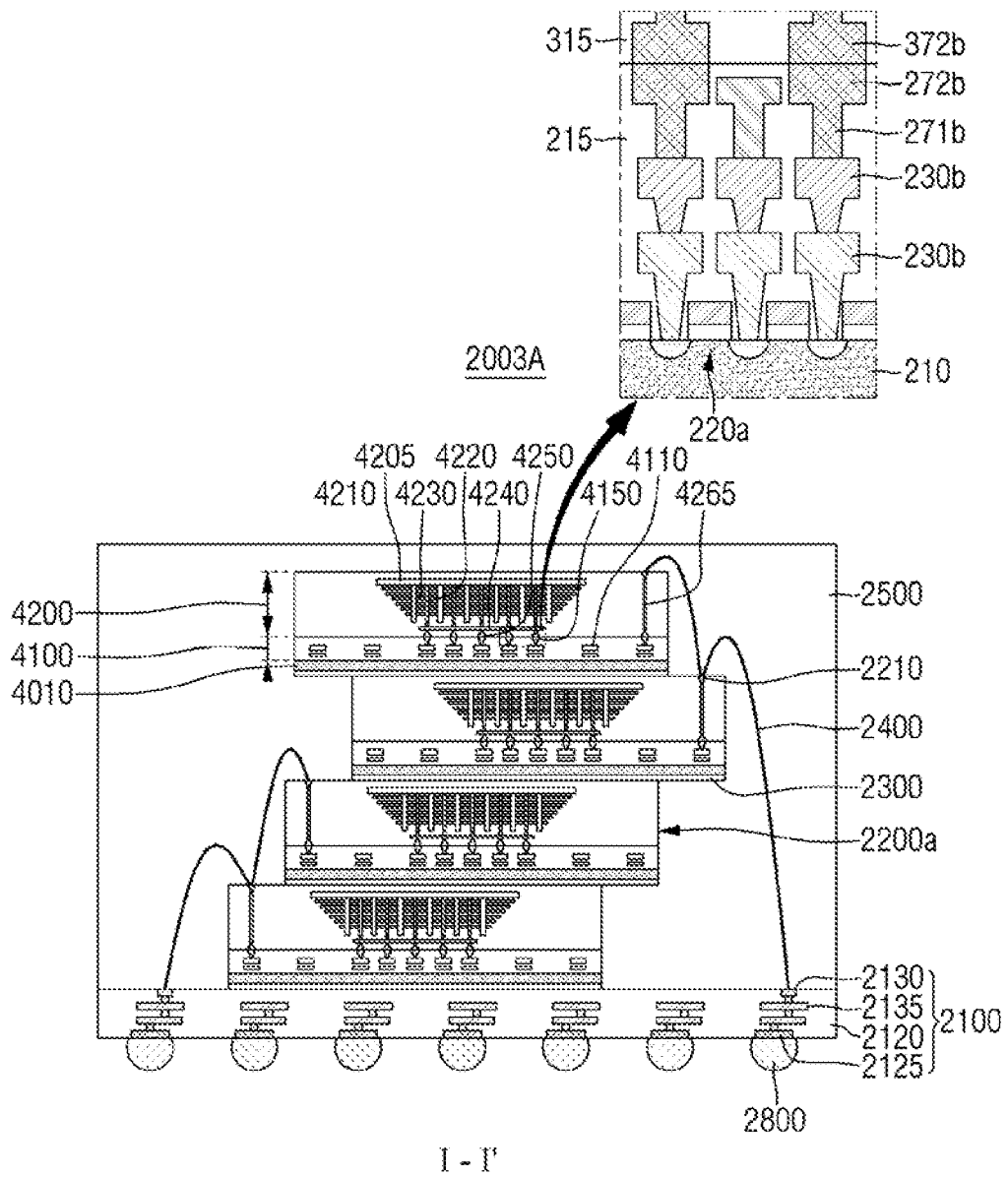
FIG. 19 is an cross-sectional view of a region of a nonvolatile memory package of FIG. 18 that includes a nonvolatile memory device according to some embodiments, taken along a line I-I'.

FIG. 19 is a cross-sectional view of a region of the nonvolatile memory package of FIG. 18 that includes a nonvolatile memory device according to some embodiments, taken along a line I-I'.

Referring to FIG. 19, in some embodiments, in a semiconductor package 2003A, each of the semiconductor chips 2200a includes a semiconductor substrate 4010, a first structure 4100 on the semiconductor substrate 4010, and a second structure 4200 on the first structure 4100 and wafer bonded to the first structure 4100.

In some embodiments, the first structure 4100 includes a peripheral circuit region that includes a peripheral wiring 4110 and first joining structures 4150. The second structure 4200 includes a common source line 4205, a plurality of metal lines 4210 between the common source line 4205 and the first structure 4100, channel structures 4220 and a separation structure 4230 that penetrates the plurality of metal lines 4210, and upper bonding metals 4250 electrically connected to the channel structures 4220 and word lines (WL of FIG. 17) of plurality of metal lines 4210. For example, the upper bonding metals 4250 are electrically connected to the respective channel structures 4220 and the word lines (WL of FIG. 17) through bit lines 4240 electrically connected to the channel structures 4220 and the first connection wirings 1115 of FIG. 17 electrically connected to the word lines (WL of FIG. 1). The lower bonding metals 4150 of the first structure 4100 and the upper bonding metals 4250 of the second structure 4200 are joined while in contact with each other. The joined portions between the first joining structure 4150 and the second joining structure 4250 are formed of, for example, copper (Cu).

In some embodiments, as shown in the enlarged view of the portion where the first structure 4100 and the second structure 4200 are coupled, since merged wirings, such as the lower metal layer 250b of FIG. 2, the lower metal layer 250a of FIG. 12, the lower metal layer 250c of FIG. 13 or the upper metal layer 370 of FIG. 15, are not exposed on the surface at which the first structure 4100 and the second structure 4200 are connected, the size and process unit cost of the first structure 4100 or the second structure 4200 can be reduced, without degrading the bonding reliability of the first structure 4100 and the second structure 4200. Each of the semiconductor chips 2200a further includes an input/output pad 2210 and an input/output connection wiring 4265 above the input/output pad 2210. The input/output connection wiring 4265 is electrically connected to some of a plurality of metal lines 4210.

In some embodiments, the semiconductor chips 2200a are electrically connected to each other by connection structures 2400 in the form of bonding wires. However, in some embodiments, the semiconductor chips in one semiconductor package, such as the semiconductor chips 2200a, are also electrically connected to each other by a connection structure that includes a through silicon via (TSV).

Figure 20:
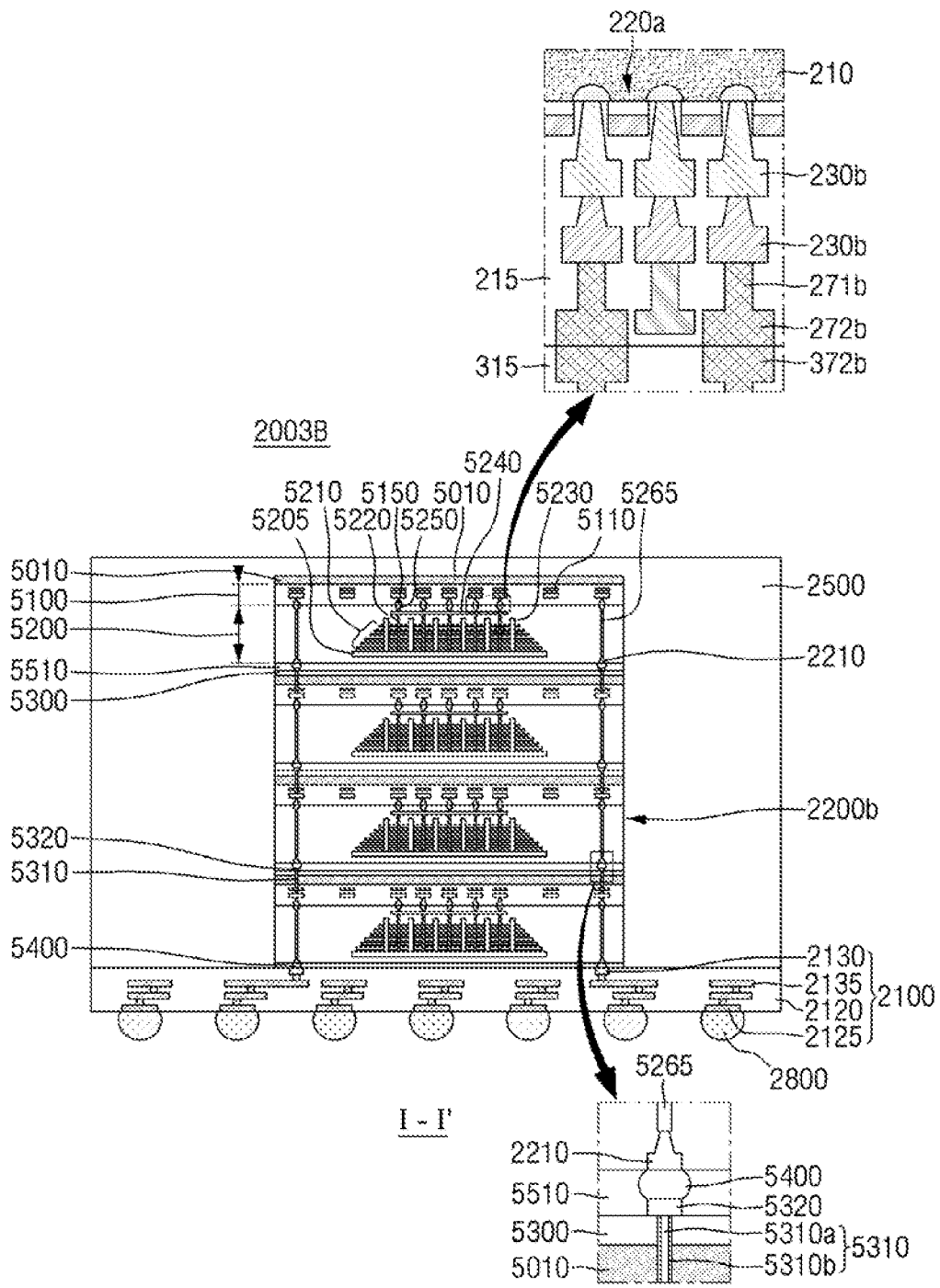
FIG. 20 is a cross-sectional view of a region of a nonvolatile memory package of FIG. 18 that includes a nonvolatile memory device according to some embodiments, taken along a line I-I'.

FIG. 20 is a cross-sectional view of a region of a nonvolatile memory package of FIG. 18 that includes a nonvolatile memory device according to some embodiments, taken along a line I-I'.

Referring to FIG. 20, in some embodiments, in a semiconductor package 2003B, the semiconductor chips 2200b are stacked on and aligned with each other. Each of the semiconductor chips 2200b includes a semiconductor substrate 5010, a first structure 5100 formed below the semiconductor substrate 5010, and a second structure 5200 placed below the first structure 5100 and wafer bonded to the first structure 5100.

In some embodiments, the first structure 5100 includes a peripheral circuit region that includes a peripheral wiring 5110 and first joining structures 5150. The second structure 5200 includes a common source line 5205, a plurality of metal lines 5210 between the common source line 5205 and the first structure 5100, channel structures 5220 and separation structures 5230 that penetrate the plurality of metal lines 5210, and upper bonding metals 5250 electrically connected to each of the channel structures 5220 and the word lines (WL of FIG. 17) of the plurality of metal lines 5210. For example, the upper bonding metals 5250 are electrically connected to the channel structures 5220 and the word lines (WL of FIG. 17) through the bit lines 5240 electrically connected to the channel structures 5220 and the first connection wirings 1115 of FIG. 17 electrically connected to the word lines (WL of FIG. 17). The lower bonding metals 5150 of the first structure 5100 and the upper bonding metals 5250 of the second structure 5200 are joined while in contact with each other. The joined portion between the first joining structures 5150 and the second joining structures 5250 is formed of, for example, copper (Cu).

In some embodiments, as shown in the enlarged view of the portion where the first structure 5100 and the second structure 5200 are coupled, since the merged wirings, such as the lower metal layer 250b of FIG. 2, the lower metal layer 250a of FIG. 12, the lower metal layer 250c of FIG. 13 or the upper metal layer 370 of FIG. 15, are not exposed on the surface at which the first structure 5100 and the second structure 5200 are connected, the size and unit cost of the first structure 5100 or the second structure 5200 can be reduced without degrading bonding reliability of the first structure 5100 and the second structure 5200. Each of the semiconductor chips 2200b further includes an input/output pad 2210 and an input/output connection wiring 5265 above the input/output pad 2210. The input/output connection wiring 5265 is electrically connected to some of the plurality of metal lines 5210.

In some embodiments, the remaining semiconductor chips of the semiconductor chips 2200b, except the uppermost semiconductor chip, each include a rear insulation layer 5300 on the semiconductor substrate 5010, rear input/output pads 5320 on the rear insulation layer 5300, and through silicon via structures 5310 that penetrate the semiconductor substrate 5010 and the rear insulation layer 5300 and electrically connect the peripheral wirings 5110 of the first structure 5100 and the rear input/output pads 5320. Each of the through silicon via structures 5310 includes a through silicon via 5310a and an insulating spacer 5310b that surrounds the side faces of the through silicon via 5310a. The semiconductor device 2003B further includes connection structures 5400, such as conductive bumps, placed below each of the semiconductor chips 2200b. The connection structures 5400 electrically connect the semiconductor chips 2200b, and electrically connect the semiconductor chips 2200b and the package substrate 2100. An underfill material layer 5510 surround the side faces of the conductive bump 5400.

In concluding the detailed description, those skilled in the art will appreciate that many variations and modifications can be made to embodiments without substantially departing from principles of the present disclosure. Therefore, disclosed embodiments of the disclosure are used in a generic and descriptive sense only and not for purposes of limitation.

What is claimed is:

1. A nonvolatile memory device, comprising
a first lower interlayer insulation layer and a second lower interlayer insulation layer that are sequentially stacked in a first direction;
a lower metal layer disposed in the first lower interlayer insulation layer; and
a plurality of lower bonding metals disposed in the first lower interlayer insulation layer and the second lower interlayer insulation layer and spaced apart from each other in a second direction that intersects the first direction,
wherein an uppermost surface in the first direction of the lower metal layer is lower than an uppermost surface in the first direction of the plurality of lower bonding metals, and
the lower metal layer is placed between the plurality of lower bonding metals,
a bottom surface in the first direction of the lower metal layer and a bottom surface in the first direction of the plurality of lower bonding metals are substantially coplanar, and
an upper surface in the first direction of the lower metal layer is disposed below an upper surface in the first direction of the plurality of lower bonding metals.

2. The nonvolatile memory device of claim 1, wherein two or more lower metal layers are placed between the plurality of lower bonding metals.

3. The nonvolatile memory device of claim 1, further comprising:
peripheral circuit elements electrically connected to the lower metal layer.

4. The nonvolatile memory device of claim 3, wherein the peripheral circuit elements include a page buffer circuit.

5. The nonvolatile memory device of claim 3, further comprising:
an input/output contact plug electrically connected to the lower metal layer; and
an input/output pad electrically connected to the input/output contact plug,
wherein the input/output pad is electrically connected to the peripheral circuit elements.

6. The nonvolatile memory device of claim 1, further comprising:
a plurality of circuit elements electrically connected to the lower metal layer.

7. The nonvolatile memory device of claim 1, further comprising:
a plurality of upper bonding metals disposed on the plurality of lower bonding metals and that are in contact with the uppermost surface of the plurality of lower bonding metals; and
an upper metal layer disposed between the plurality of upper bonding metals,
wherein an uppermost portion of the upper metal layer is located at a same height as an uppermost portion of the plurality of upper bonding metals, and
a height of a lowermost portion of the upper metal layer is higher than a lowermost portion of the plurality of upper bonding metals.

8. The nonvolatile memory device of claim 7, further comprising:
a first upper interlayer insulation layer and a second upper interlayer insulation layer that are sequentially stacked on the plurality of lower bonding metals,
wherein the first upper interlayer insulation layer and the second upper interlayer insulation layer surround the upper bonding metals, and
the second upper interlayer insulation layer surrounds the upper metal layer.

9. A nonvolatile memory device, comprising:
a first substrate;
a plurality of metal lines stacked on the first substrate in a first direction;
a channel structure that penetrates the plurality of metal lines;
a plurality of upper metal layers electrically connected to the plurality of metal lines and the channel structure;
a plurality of upper bonding metals electrically connected to one or more of the plurality of upper metal layers;
a first lower interlayer insulation layer and a second lower interlayer insulation layer that are sequentially stacked on the upper bonding metals;
a plurality of lower bonding metals electrically connected to the upper bonding metals and disposed in the first lower interlayer insulation layer and the second lower interlayer insulation layer; and
a lower metal layer placed between the plurality of lower bonding metals, electrically connected to peripheral circuit elements, and disposed in the second lower interlayer insulation layer,
wherein an uppermost surface in the first direction of the lower metal layer is lower than a height at which the plurality of lower bonding metals and the plurality of upper bonding metals meet.

10. The nonvolatile memory device of claim 9, wherein two or more lower metal layers are placed between the plurality of lower bonding metals.

11. The nonvolatile memory device of claim 9, further comprising:
an input/output contact plug electrically connected to the lower metal layer; and
an input/output pad electrically connected to the input/output contact plug,
wherein the input/output pad is electrically connected to the peripheral circuit elements.

12. The nonvolatile memory device of claim 9, further comprising:
a plurality of circuit elements electrically connected to the lower metal layer.

13. The nonvolatile memory device of claim 12, wherein the lower metal layer is electrically connected to at least one of the plurality of lower bonding metals, and
the plurality of circuit elements switches at least one of the plurality of metal lines.

14. The nonvolatile memory device of claim 9, wherein a lowermost portion of the upper metal layer is located at a same height as a lowermost portion of the plurality of upper bonding metals, and
a height of an uppermost portion of the upper metal layer is lower than that of an uppermost portion of the plurality of upper bonding metals.

15. The nonvolatile memory device of claim 14, further comprising:
a first upper interlayer insulation layer and a second upper interlayer insulation layer that surround the plurality of upper bonding metals and are sequentially stacked in the first direction,
wherein the first upper interlayer insulation layer surrounds the upper metal layer.

16. A nonvolatile memory system, comprising:
a main board;

a nonvolatile memory device disposed on the main board; and a controller that is electrically connected to the nonvolatile memory device on the main board, wherein the nonvolatile memory device includes a first substrate, a lower metal layer disposed on the first substrate and spaced apart from the first substrate in a first direction, and a plurality of lower bonding metals that are spaced apart from each other in a second direction that intersects the first direction, wherein an uppermost surface in the first direction of the lower metal layer is lower than an uppermost surface in the first direction of the plurality of lower bonding metals, and the lower metal layer is placed between the plurality of lower bonding metals.

17. The nonvolatile memory system of claim 16, further comprising:

a first lower interlayer insulation layer and a second lower interlayer insulation layer that are sequentially stacked on the first substrate in the first direction, wherein the lower metal layer is disposed in the first lower interlayer insulation layer, and the plurality of lower bonding metals are disposed in the first lower interlayer insulation layer and the second lower interlayer insulation layer.

18. The nonvolatile memory system of claim 16, wherein the nonvolatile memory device further comprises:

upper bonding metals that are electrically connected to the plurality of lower bonding metals, a plurality of metal lines that are electrically connected to the upper bonding metals and sequentially stacked in the first direction, a channel structure that is electrically connected to the upper bonding metals and that penetrates the plurality of metal lines, and a second substrate placed on the plurality of metal lines and the channel structure and spaced apart from the first substrate in the first direction.

19. The nonvolatile memory system of claim 16, wherein two or more lower metal layers are placed between the plurality of lower bonding metals.

20. The nonvolatile memory system of claim 16, further comprising:

peripheral circuit elements electrically connected to the lower metal layer.

* * * * *